US007106980B2

(12) United States Patent
Nakanishi et al.

(10) Patent No.: US 7,106,980 B2
(45) Date of Patent: Sep. 12, 2006

(54) OPTICAL RECEIVER

(75) Inventors: Hiromi Nakanishi, Osaka (JP);
Naoyuki Yamabayashi, Osaka (JP);
Yoshiki Kuhara, Osaka (JP)

(73) Assignee: Sumitomo Electric Industries, Ltd.,
Osaka (JP)

(*) Notice: Subject to any disclaimer, the term of this patent is extended or adjusted under 35 U.S.C. 154(b) by 792 days.

(21) Appl. No.: 10/015,898

(22) Filed: Dec. 17, 2001

(65) Prior Publication Data

US 2002/0080457 A1 Jun. 27, 2002

(30) Foreign Application Priority Data

Dec. 25, 2000 (JP) .............................. 2000-391901
Jun. 11, 2001 (JP) .............................. 2001-175093

(51) Int. Cl.
*G02B 6/42* (2006.01)
(52) U.S. Cl. .................. 398/212; 398/202; 398/139; 385/49
(58) Field of Classification Search ............. 398/202, 398/139, 212; 385/14, 24, 47, 49, 88, 89, 385/92, 93; 257/189
See application file for complete search history.

(56) References Cited

U.S. PATENT DOCUMENTS 5,519,526 A * 5/1996 Chua et al. ................ 398/139
5,696,862 A * 12/1997 Hauer et al. ................. 385/88
5,960,135 A * 9/1999 Ozawa ........................ 385/24
6,215,917 B1 * 4/2001 Takahashi et al. ............ 385/14
6,327,407 B1 * 12/2001 Mitsuda et al. .............. 385/49
6,567,590 B1 * 5/2003 Okada et al. ................. 385/49

OTHER PUBLICATIONS

Y. Murakami et al. "Development of Simplified WDM System—Development of Compact EDFA and Optical Receiver Provided with Optical BPF" *Technical Report of IEICE OCS99-60* (Sep. 1999) pp. 41-46.

* cited by examiner

*Primary Examiner*—David C. Payne
(74) *Attorney, Agent, or Firm*—Smith, Gambrell & Russell, LLP

(57) ABSTRACT

An optical receiver, small and inexpensive, is used for a WDM transmission system in place of a wavelength demultiplexer. In the receiver, a light-transmitting medium and a photodiode (PD) are placed on the same substrate, a wavelength-selecting filter is attached perpendicularly or obliquely to the end face of or to a cut section at the midpoint of the medium, the filter transmits only the assigned wavelength included in the incident light having multiplexed wavelengths, and the PD detects only the assigned wavelength. With an optical fiber, the fiber can be housed in a ferrule. In this case, the filter is inserted into a filter-supporting hole provided at a midpoint of the ferrule, the ferrule is fixed in a groove formed on the substrate, and an optical pathway-changing groove formed on the substrate reflects light having emerged from the optical fiber to introduce it into the PD.

20 Claims, 12 Drawing Sheets

Embodiment 1

Embodiment 1

Embodiment 1

Embodiment 2

Embodiment 2

Embodiment 3

Embodiment 3

Embodiment 4

Embodiment 4

Embodiment 5

Embodiment 5

Embodiment 6

Embodiment 6

Embodiment 7

Embodiment 7

Embodiment 8

Embodiment 8

Embodiment 8

Embodiment 9

Embodiment 10

Embodiment 11

Embodiment 12

Embodiment 13

OPTICAL RECEIVER

BACKGROUND OF THE INVENTION

1. Field of the Invention

The present invention relates to an optical receiver for an optical communication system, particularly an optical receiver that can be used advantageously in an optical wavelength division multiplexing (WDM) communication system that transmits signals by using light having a plurality of different wavelengths.

2. Description of the Background Art

As optical communication systems become prevalent in the world, they have been increasingly incorporating WDM transmission systems that use a plurality of wavelengths in order to further increase the capacity of communication. In particular, researchers and engineers have been studying a system that connects a central office and subscribers by using a plurality of wavelengths, for example from four to sixteen wavelengths, in order to introduce optical fibers into the subscribers' lines at low cost.

In this case, a high-performance wavelength multiplexer is placed at a wavelength multiplexing point at a ratio of m:1 (m: the degree of multiplexing) at a central office to produce light having multiplexed wavelengths. At the subscribers' side, on the other hand, a high-performance wavelength demultiplexer is placed at a wavelength demultiplexing point at a ratio of 1:m to separate the light according to individual wavelengths. Supposing that the light has multiplexed wavelengths consisting of $\lambda_1, \lambda_2, \ldots, \lambda_m$, the wavelength demultiplexer selects light having a wavelength, $\lambda_j$, assigned to the j-th subscriber to send the selected light to the optical fiber for the j-th subscriber. In principle, any wavelength demultiplexer can also be used as a multiplexer. Thus, for simplicity, the word "multiplexer" is used in this specification as a general term to refer to both multiplexers and demultiplexers, except when it is necessary to distinguish the two devices or functions. Because high-performance optical wavelength multiplexers can multiplex and demultiplex a multitude of wavelengths at a time, they have already been put into practical use in long-distance, wide-area transmission systems.

In order to apply the above-mentioned WDM communication system to a small area, it is essential to construct the system at low cost. Conventional optical wavelength multiplexers placed at wavelength multiplexing points at a ratio of m:1 and at wavelength demultiplexing points at a ratio of 1:m are extremely high-cost, which as a result increases the cost of the WDM communication system. Consequently, researchers and engineers have been studying to develop a system in which no expensive optical wavelength multiplexers are used.

One of the studies has been reported by Y. Murakami and M. Kouchi in a report, entitled "Development of simplified WDM system—Development of compact EDFA and optical receiver provided with optical BPF," in the Technical Report of IEICE OCS99-60 (1999–09) (pp. 41–46), where IEICE is a abbreviation for The Institute of Electronics, Information and Communication Engineers of Japan.

The WDM communication system in this report uses inexpensive star couplers, in place of optical wavelength multiplexers, at wavelength multiplexing points and wavelength demultiplexing points. Because a star coupler has no function of wavelength separation, it distributes light having the same wavelength spectrum to all the optical fibers connected to it. At a light-receiving side, a band pass filter (BPF) selects light having the wavelength $\lambda_j$ to receive it.

In the system proposed in the report, it is advantageous to bring the wavelengths of a plurality of optical signals closer to one another so that the number of subscribers can be increased. However, when the neighboring wavelengths are close to each other, strict control over the accuracy of the wavelength of light produced by an optical source and over the accuracy of the wavelength of light received by an optical receiver is required. Consequently this increases the cost. In this report, the system is designed to use eight wavelengths in the 1.5 μm band, with each wavelength having a band width of 3.2 nm. More specifically, eight center wavelengths are assigned to, for instance, 1,536.6 nm, 1,539.8 nm, 1,543.0 nm, . . . , 1,559.0 nm at 3.2-nm intervals. Because the center wavelengths are assigned at extremely narrow intervals, the light-emitting devices must be laser diodes (LDs) having an extremely sharp spectrum in the emitted light at the assigned center wavelength. Similarly, at a light-receiving device side, it is necessary to use a wavelength-selecting filter having a sharp wavelength selectivity.

Some terms used in this specification are defined below. Supposing that the number of different wavelengths used in a WDM transmission system is m, the wavelengths are denoted in $\lambda_1, \lambda_2, \ldots, \lambda_m$. Supposing that the same interval is given to the neighboring wavelengths, the interval is denoted in $\Delta$. Of course, different intervals may be employed.

Supposing that the number of subscribers (optical network units: ONUs) is m, the subscribers are denoted in $U_1$, $U_2, \ldots, U_m$. The j-th subscriber, $U_j$, exclusively receive the j-th wavelength, $\lambda_j = \lambda_1 + (j-1)\Delta$. Consequently, the wavelength $\lambda_j$ is referred to as "the assigned wavelength" for the subscriber $U_j$. The set of the other wavelengths, $\lambda_1$, $\lambda_2, \ldots, \lambda_{j-1}, \lambda_{j+1}, \ldots, \lambda_m$, is referred to as "the complementary wavelength" and denoted in $\Gamma_j$. Hence, $\Gamma_j = \{\lambda_1, \lambda_2, \ldots, \lambda_{j-1}, \lambda_{j+1}, \ldots, \lambda_m\}$. This can also be expressed in $\Gamma_j = \Lambda - \lambda_j$, where $\Lambda$ signifies the set of all the wavelengths.

The j-th LD, which emits light having the wavelength $\lambda_j$, is denoted in $L_j$. The light emitted from $L_j$ has a sharp peak at the wavelength $\lambda_j$. The band width assigned to each wavelength is $\Delta$ or less, which is extremely narrow. The j-th filter, $F_j$, selectively transmits the assigned wavelength $\lambda_j$ out of the set of all the wavelengths, $\Lambda = \{\lambda_1, \lambda_2, \ldots, \lambda_m\}$, reflecting the complementary wavelength, $\Gamma_j = \{\lambda_1, \lambda_2, \ldots, \lambda_{j-1}, \lambda_{j+1}, \ldots, \lambda_m\}$.

The system in the report uses a star coupler, which is low in cost and has no function of wavelength separation, for multiplexing and demultiplexing wavelengths. Consequently, an optical receiver must select the assigned wavelength on its own. However, photodiodes (PDs) based on InGaAs, conventionally used for optical communications, have high sensitivity in a wide wavelength spectrum from 1.0 to 1.6 μm. In other words, an InGaAs-based PD has no wavelength selectivity. Therefore, the system in the report places a BPF that selectively transmits the assigned wavelength forward of the PD in an optical receiver.

A BPF is produced by laminating a plurality of layers consisting of at least two types of dielectric layers having different refractive indexes and thicknesses. It transmits a specified wavelength only. The system in the report uses a BPF that transmits the assigned wavelength, $\lambda_j$, and reflects the other wavelengths, i.e., the complementary wavelength, $\Gamma_j$.

FIG. 1 shows a cross-sectional view of an optical receiver used in the report. A disc-shaped metal stem 1 mounts a PD 2. Although not shown in the figure, the stem 1 has pins, to which the upper and lower electrodes of the PD 2 are connected with wires. The stem 1 is securely inserted into a lens holder 4, made of cylindrical metal, that holds a lens 3 at the forward opening. The lens holder 4 is inserted into a larger cylindrical housing 5. A cylindrical holder 6 is welded to the end of the housing 5 in optical alignment.

A cylindrical inverse collimator 7, a disc-shaped BPF 8, and a cylindrical collimator 9 are inserted into the holder 6 in optical alignment. A cylindrical ferrule 11, also, is inserted into the holder 6 to support the end of an optical fiber 10.

Incoming light having multiplexed wavelengths has all the wavelength components ($\Lambda=\{\lambda_1, \lambda_2, \ldots, \lambda_m\}$). A beam of incoming light emerges from the optical fiber 10, is spread out by the collimator 9 to become a parallel beam, and is subjected to the wavelength selection carried out by the BPF 8. The BPF 8 transmits the assigned wavelength only and reflects the complementary wavelength. The transmitted light is focused through the inverse collimator 7, passes through an opening 12, enters the housing 5, is focused through the lens 3, and finally enters the PD 2. Thus, the PD 2 detects the assigned wavelength $\lambda_j$ only.

As mentioned above, a collimator is provided in an optical receiver, because a BPF made of a dielectric multilayer film cannot perform strict wavelength selection unless a parallel beam of light is supplied. Even a slight gradient of a beam can cause an error in the wavelength selectivity. When light emerges from an optical fiber, the beam of light spreads out in accordance with the numerical aperture (NA) determined by the refractive indexes of the core and cladding. Divergent rays of a beam have different angles of gradient in the cross section. Therefore, the BPF cannot select the assigned wavelength accurately under this condition. It is necessary to use a collimator to introduce light in the form of a parallel beam into a BPF made of a dielectric multilayer film.

The optical receiver shown in FIG. 1 is large and extremely expensive because it is composed of a housing, a lens holder, and a holder to house and secure a lens, a collimator, and an inverse collimator. The optical receiver measures no less than 7 to 10 mm in diameter and 15 to 20 mm in length. It is difficult for a system that requires such large and expensive devices to come into widespread use as a communication system for connecting subscribers of general households.

SUMMARY OF THE INVENTION

The present invention has a feature in that a wavelength-selecting filter is attached intimately to the end face of or to a cut section at a midpoint of a light-transmitting medium such as an optical fiber or waveguide that introduces incoming light. Light having passed through the filter is introduced to a PD. This method gives wavelength selectivity to a surface-mounted optical receiver. Since the filter is in intimate contact with the end face of or with a cut section of a light-transmitting medium, it can select the assigned wavelength while the beam of light practically remains parallel. This method stabilizes the performance of the optical receiver. Therefore, it is not necessary to rely on a collimator, an inverse collimator, and a lens. Consequently, the present invention can offer an optical receiver small in size, few in the number of parts, simple in assembly, and, above all, low in cost.

Although the wavelength-selecting filter is in intimate contact with the end face of or with a cut section of a light-transmitting medium, a minuscule gap between the filter and the light-transmitting medium cannot be avoided. The gap is filled with a transparent resin having a refractive index comparable to that of the light-transmitting medium.

Whether the wavelength-selecting filter is attached to the end face of a light-transmitting medium or inserted into a cut portion at a midpoint of a light-transmitting medium, it is desirable that the light-receiving face of the filter be slanted at an angle of 4 to 12 degrees to the plane perpendicular to the optical axis (the angle is called the oblique angle $\Theta$). This slant can prevent the reflected light from returning to the LD in a light source to cause LD instability. Actually, when the difference in the refractive index is sufficiently small between the light-transmitting medium and the filter and between the light-transmitting medium and the resin that fills the gap, the reflected light causes no problem. In this case, therefore, no slant is required. However, an oblique filter is more desirable in many cases. The phenomena when the filter is slanted are explained below.

When a wavelength-selecting filter is intimately attached to the end face of or to a cut section of a light-transmitting medium, the filter can select the assigned wavelength while the beam of light practically remains parallel. Consequently, only the light having the assigned wavelength passes through the filter without disturbance. The unwanted wavelengths (the complementary wavelength) are reflected completely at the filter. The reflected light is placed in a dissipation mode and dissipates because it is slanted to the optical axis by the amount of $2\Theta$, two times the oblique angle $\Theta$ of the filter. The light having the assigned wavelength can be detected by a PD having a photo-sensitive area with a large diameter. Even if the PD has a wide range of sensitivity in the wavelength spectrum, there is no possibility of crosstalk because the transmitted light has single wavelength only.

DETAILED DESCRIPTION OF THE INVENTION

Figure 1:
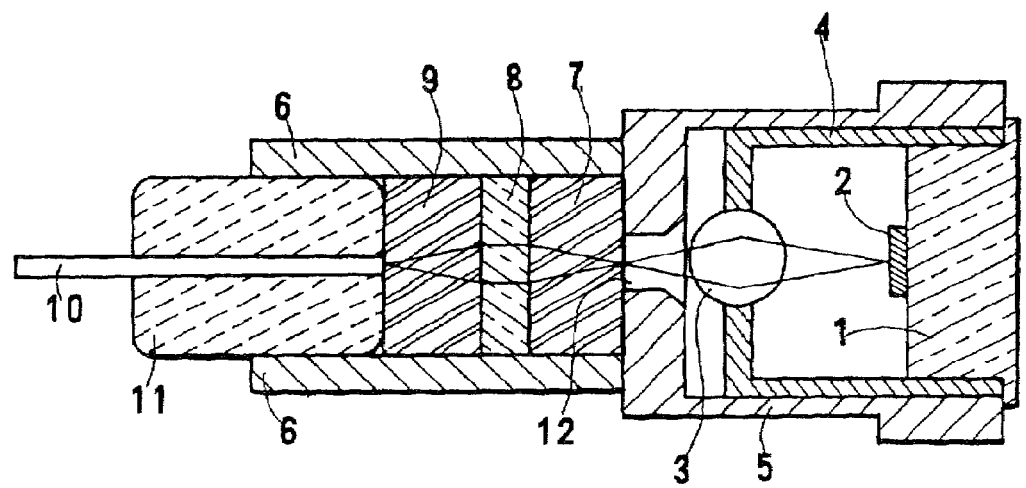
FIG. 1 is a cross-sectional view of an optical receiver used in a prior art for WDM communication.

In the present invention, a wavelength-selecting filter is attached perpendicularly or obliquely to the end face of or to a cut section at a midpoint of a light-transmitting medium. The filter transmits only an assigned wave length to introduce it into a PD. The light-transmitting medium is composed of an optical fiber or an optical waveguide. In the case of an optical fiber, the optical fiber can be securely inserted into a V-shaped groove formed on a substrate. An optical waveguide comprises an $SiO_2$ under-cladding layer and an $SiO_2$ over-cladding layer formed on a substrate and a linear core sandwiched between the two claddings. The core is made of $SiO_2$ doped with an impurity that increases the refractive index, such as $GeO_2$. Light propagates in the core, which has a higher refractive index.

In the present invention, a wavelength-selecting filter is attached to the end face of or to a cut section at the midpoint of a light-transmitting medium. In the case of the end face, the end face of an optical fiber or an optical waveguide is slanted, and the filter is intimately attached to it, for example, by using adhesive. It is desirable that the adhesive be transparent and have a refractive index comparable to that of the optical fiber or waveguide. However, because the adhesive layer is extremely thin, a small amount of difference in refractive index poses practically no problem provided that the adhesive is transparent. Since the filter is attached to the end face of the light-transmitting medium, it is necessary to provide a space between the light-transmitting medium and a PD. In order to prevent a beam of light from spreading out in the space, it is desirable to fill the space with a transparent resin having a refractive index comparable to that of the light-transmitting medium.

When a wavelength-selecting filter is inserted into a midpoint of a light-transmitting medium, an oblique space can be provided so that the filter can be inserted thereinto and fixed. In this case, also, the filter is cemented with transparent adhesive. Notwithstanding that the adhesive layer separates the filter from the light-transmitting medium, essentially no angular dispersion of a beam of light occurs when the transparent adhesive has a refractive index comparable to that of the light-transmitting medium. Since the beam of light practically maintains the original conditions in angle, light having passed through the filter can enter the light-transmitting medium again. This mechanism is explained later.

A substrate used for an optical receiver of the present invention can be a single-crystalline Si substrate, a single-crystalline GaAs substrate, a single-crystalline InP substrate, or another single-crystalline semiconductor substrate. These types of substrates allow the formation of grooves and other structures by anisotropic etching and isotropic etching. A plastic substrate, ceramic substrate, or glass substrate can also be used. These substrates are less costly and easy to handle; grooves and other structures can be formed by a mechanical means.

When a wavelength-selecting filter is provided perpendicularly to the optical axis, if reflected light is intense, the reflected light returns to an LD in a light source, causing the LD to be unstable. To avoid this detrimental phenomenon by preventing the reflected light from returning to the LD, it is desirable that a filter-fixing face and a filter-fixing space be slanted to the plane perpendicular to the optical axis at the oblique angle $\Theta$. The desirable oblique angle $\Theta$ is approximately 4 to 12 degrees. The filter reflects unwanted light, and the reflected light forms an angle of $2\Theta$ to the optical axis. When the refractive index of a core is denoted in $n_0$ and that of a cladding in $n_d$, the critical angle of the beam of light that can propagate is given in $\cos^{-1}(n_d/n_0)$. If the angle of gradient, $2\Theta$, of the reflected light is larger than the critical angle, $\cos^{-1}(n_d/n_0)$, the reflected light is placed in a dissipation mode, i.e., it passes through the cladding, exits to the outside, and then dissipates. This condition is expressed in equation (1).

$$2\Theta > \cos^{-1}(n_d/n_0) \qquad (1).$$

With ordinary core materials and cladding materials, the condition $\Theta=4$ degrees satisfies this inequality. The condition $\Theta=12$ degrees is not derived from optical conditions. If the angle is excessively large, it is technically difficult to provide an oblique groove and an oblique end face on a substrate.

A wavelength-selecting filter is produced by laminating a multitude of dielectric layers on a substrate made of glass, a plastic material such as polyimide, or another material. Various combinations of the refractive indexes and thicknesses of the dielectric layers enable the design of the filter that can transmit the assigned wavelength, reflecting the complementary wavelength. It is effective to increase the number of layers in order to increase the wavelength selectivity A PD can be of any type, such as a back-illuminated type, a top-illuminated type, a side-illuminated type, and a waveguide type.

Different types of PD have different types of pathways that introduce light into the PD after emerging from a wavelength-selecting filter. In the case of a back-illuminated PD, an optical pathway-changing groove is provided between a light-transmitting medium and the PD, the PD is mounted such that it straddles the end portion of the groove with its back face facing the groove, and the groove reflects light having emerged from the light-transmitting medium to introduce it into the back face of the PD. In the case of a top-illuminated PD, an optical pathway-changing groove is provided between a light-transmitting medium and the PD, the PD is mounted upside down such that it straddles the end portion of the groove with its reversed top face facing the groove, and the groove reflects light having emerged from the light-transmitting medium to introduce it into the reversed top face of the PD. In the case of a side-illuminated PD and a waveguide-type PD, the PD is placed in the vicinity of the end face of the light-transmitting medium without using an optical pathway-changing groove so that light having emerged from the light-transmitting medium can enter the side face of the PD without being reflected.

In any type of PD, it is necessary to cover the light-transmitting medium such as an optical fiber or waveguide, the wavelength-selecting filter, and the PD with a transparent resin. One reason is that when the principal parts are encapsulated in an opaque resin afterward, the transparent resin prevents the optical pathway from being clogged by the opaque resin. Another reason is to reduce the divergent angle of a beam of light so that the percentage of light incident onto the PD can be increased. Yet another reason is to reduce reflection at the boundaries. In order to reduce the divergent angle and reflection, the transparent resin should have a refractive index comparable to that of the light-transmitting medium. Yet another object of the transparent resin is to reduce the deflection angle (the refraction angle).

A transparent resin reduces the divergent angle of a beam of light by the mechanism described below. As described previously, when light emerges from an optical fiber into the air, the beam of light spreads out in accordance with the NA of the optical fiber. When the divergent angle is denoted in θ, the NA is given in equation (2).

$$NA(\text{in air}) = \sin\theta = (n_0^2 - n_d^2)^{1/2} \quad (2),$$

where $n_0$: the refractive index of the core of a light-transmitting medium, and $n_d$: the refractive index of the cladding of a light-transmitting medium.

Equation (2) shows the NA when light enters the air. When light enters transparent resin having a refractive index of $n_r$, the NA is given in equation (3).

$$NA(\text{in resin}) = \sin\theta' = (n_0^2 - n_d^2)^{1/2}/n_r \quad (3),$$

where θ': the divergent angle.

For example, if $n_r$ is 1.5, the divergent angle θ' decreases by a factor of about 1.5. This decrease is equivalent to the decrease in solid angle by a factor of about 2. This calculation demonstrates that when emerging from an optical fiber or waveguide into a transparent resin, a beam of light shows practically no divergence.

Furthermore, equation (3) has an intrinsically important meaning in the present invention. When a wavelength-selecting filter is directly attached to an optical fiber or waveguide, the NA is dependent on the refractive index of the filter. The refractive indexes of the dielectric layers of the filter are not the same. When the average refractive index is denoted in $n_f$ including the refractive index of the substrate of the filter, the NA when light enters the filter is obtained by replacing $n_r$ with $n_f$ in equation (3). Equation (4) below gives the divergent angle θ" in the filter.

$$NA(\text{in filter}) = \sin\theta'' = (n_0^2 - n_d^2)^{1/2}/n_f \quad (4)$$

When the filter is intimately attached to an optical fiber or waveguide, the NA decreases by a factor of $n_f$. Consequently, the beam of light has a small amount of gradient, and accurate wavelength selectivity can be maintained. Because the substrate constitutes the major portion of the thickness of the filter, $n_f$ is assumed to be practically equal to the refractive index of the substrate.

The mechanism of a reduction in deflection angle at a boundary is explained below. When the boundary in contact with air is slanted at an angle of Θ, the refraction angle Φ(air) is expressed in equation (5).

$$\Phi(\text{air}) = \sin^{-1}(n_0 \sin\Theta) - \Theta \quad (5).$$

This angle is considerably large. When the substance outside the boundary is a transparent resin having a refractive index of $n_r$, the refraction angle Φ(transparent resin) is expressed in equation (6).

$$\Phi(\text{transparent resin}) = \sin^{-1}(n_0 \sin\Theta/n_r) - \Theta \quad (6).$$

For example, when Θ=8 degrees, $n_0$=1.46, and $n_r$=1.50, Φ(transparent resin) is −0.2 degrees. In the case of air, since $n_r$=1.0, Φ(air) is 3.7 degrees. This means that when the filter is slanted at an angle of 8 degrees, a beam of light emerging from the filter into the air is refracted at an angle no less than 3.7 degrees in the direction of the slant of the end face. On the other hand, the beam of light is practically free from refraction (deflection) at the boundary between the filter and the transparent resin.

Embodiments of the present invention are explained below by referring to the accompanying drawings. In the drawings, the same member bears the same sign so that duplicated explanation can be avoided. The ratios of the dimensions in the drawings do not necessarily coincide with the explanation.

EMBODIMENT 1

Figure 2:
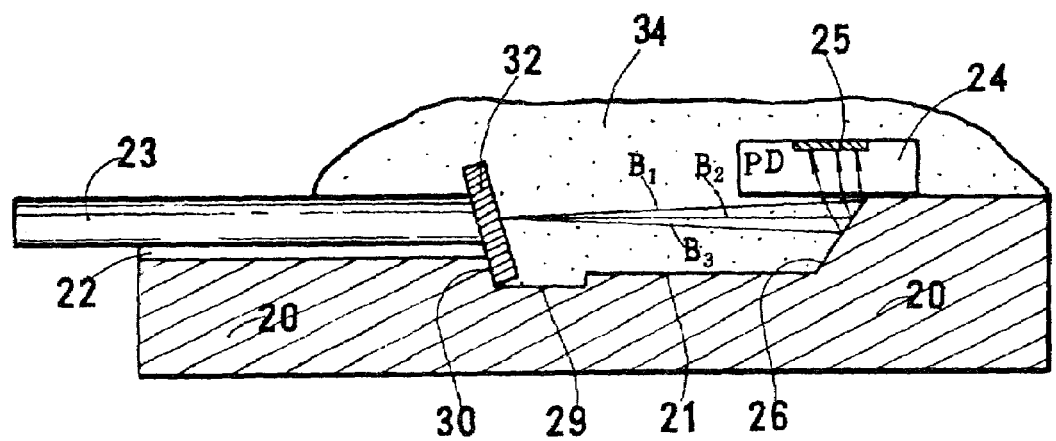
FIG. 2 is a longitudinal cross section of an optical receiver of Embodiment 1 of the present invention.
Figure 3:
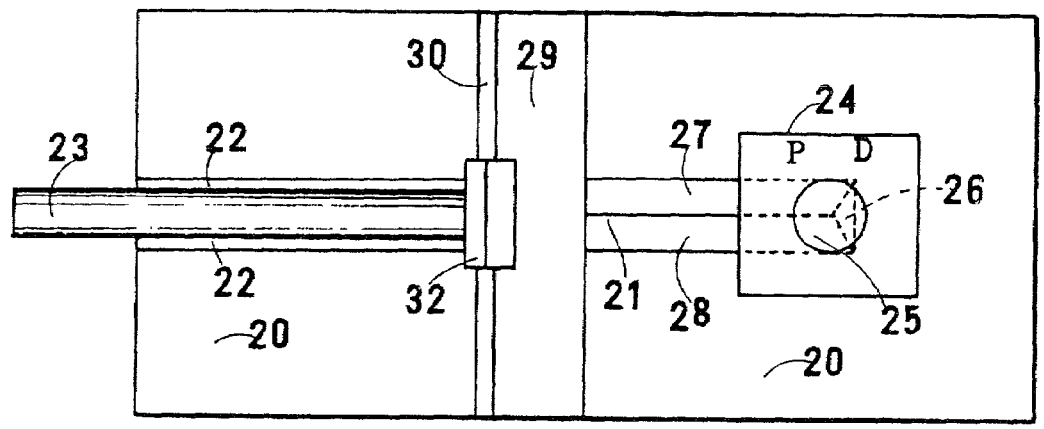
FIG. 3 is a plan view of an optical receiver of Embodiment 1 of the present invention before applying a transparent resin.

FIGS. 2 and 3 show an optical receiver of Embodiment 1 of the present invention. An optical pathway-changing groove 21 and a V-shaped groove 22 are provided on the top of an Si substrate 20, which has the shape of a rectangular solid. The V-shaped groove 22 is provided from the front end to the center portion of the substrate, and the optical pathway-changing groove 21 from the center portion to the middle portion of the rear half. They are provided on the center axis of the substrate and are separated by a lateral groove 29. An optical fiber 23 is placed in the V-shaped groove 22 and fixed there. The V-shaped groove 22 eliminates the need for the alignment work of the optical fiber. The V-shaped groove 22 can be formed by anisotropic etching. It can also be formed by a mechanical means. The lateral groove 29, can also be formed by either etching or a mechanical means.

Although not shown in the figures, an electrode pattern is printed by metallizing on the Si substrate 20 for mounting a PD. A PD 24 is cemented to the pattern on the Si substrate 20 so that the PD can straddle the end portion of the optical pathway-changing groove 21. The PD 24 is a back-illuminated type, which introduces a beam of light from the back face, and has a photo-sensitive area 25 at the upper portion. In this embodiment, the optical pathway-changing groove 21 has three faces: an oblique end face 26 and side faces 27 and 28. The oblique end face 26 is important as a mirror face. The back face of the PD 24 lies directly above the oblique end face 26.

The lateral groove 29 lies between the V-shaped groove 22 and the optical pathway-changing groove 21 and is orthogonal to the axis of the Si substrate 20. The lateral groove 29 is provided to form an oblique face of the Si substrate 20 in the proximity of the end face of the optical fiber 23. This oblique face is referred to as a wavelength selecting filter-fixing face 30, which can become flush with the end face of the optical fiber by polishing, for example. The oblique angle Θ of the end face of the optical fiber and the oblique face is specified to fall in the range of 4 to 12 degrees. A wavelength-selecting filter 32 is fixed intimately to the wavelength selecting filter-fixing face 30. Since the wavelength-selecting filter is slanted at the angle Θ, the filter is designed to transmit the assigned wavelength $\lambda_j$ when a beam of light enters at this oblique angle. This slant is provided to prevent the reflected light from returning to the optical fiber. The PD 24, the optical pathway-changing groove 21, the wavelength-selecting filter 32, and the end portion of the optical fiber 23 are covered with a transparent resin 34 having a refractive index comparable to that of the optical fiber. The role of this resin in terms of geometrical optics is that it decreases the angle of refraction at the boundaries to suppress the reflection. The resin mechanically protects the PD and the filter and prevents the optical pathway from clogging when the principal parts are encapsulated in an opaque resin afterward.

The substrate is fixed to a lead frame (not shown in the figures), the leads and the electrode terminals on the substrate are connected by wire bonding, and the principal parts of the device are securely molded with epoxy resin. The completed device is a plastic package from which lead pins and an optical fiber protrude (see FIG. 18 to obtain diagrammatic information, although the figure is provided for another embodiment).

The optical receiver having the above-described structure functions as follows: The optical fiber 23 is connected to an outside optical fiber (not shown in the figures) with an optical connector. Incoming signal-laden light propagates from the outside optical fiber to the optical fiber 23. Because of a WDM transmission system, the incoming light includes all the wavelengths. As described above, the wavelength-selecting filter 32 transmits only the assigned wavelength $\lambda_j$, reflecting the complementary wavelength.

Since the wavelength-selecting filter 32 is in firm contact with the end face of the optical fiber 23, it selects the assigned wavelength before a beam of light spreads out. Therefore, it is not necessary to rely on a lens or collimator. The beam of light having the assigned wavelength passes through the wavelength-selecting filter 32, passes through the transparent resin 34 as a beam composed of rays such as B1, B2, and B3, is reflected at the oblique end face 26, enters the PD 24 from the back face, reaches the photo-sensitive area 25, and finally generates photocurrent. The photocurrent is the signal to be received.

The optical receiver is produced by the process explained below. A basic pattern 3 mm in length and 1.5 mm in width, which corresponds to one chip, is repeatedly formed by photolithography on a 1.0-mm-thick single-crystalline Si plate having the (100) plane. The V-shaped groove 22 for fixing the optical fiber and the optical pathway-changing groove 21 are formed by etching on each of the basic patterns. A 1-μm-thick $SiO_2$ insulating layer is provided at the place on the Si substrate where the PD is to be mounted. Cr—Au electrode terminals are formed by metallizing at the place where the PD is to be bonded.

The lateral groove 29 is provided by dicing to form the wavelength selecting filter-fixing face 30. The wavelength selecting filter-fixing face 30 and the end face of the optical fiber 23 are processed to have a 4- to 12-degree slant to the plane perpendicular to the optical axis. It is desirable that the oblique angle Θ be 8 degrees. The slant is provided to prevent the reflected light from returning to the light-emitting device, the LD. The above-described preparation is carried out at the stage of wafer. On completion of the process for individual chips, the wafer is cut to obtain a multitude of chips (Si substrates) having a size of 3×1.5 mm. After this, each chip is processed individually.

The optical receiver uses a back-illuminated type of InGaAs PD having a size of 500×500×300 μm. The PD has a wide range of sensitivity including a 1.3-μm band and a 1.55-μm band. The PD is fixed to the metallized surface previously formed on the Si substrate with solder such as Au—Sn. The optical fiber is placed in the V-shaped groove to align its end face with the wavelength selecting filter-fixing face 30. The optical fiber is then fixed by using epoxy resin. The wavelength-selecting filter 32 is cemented obliquely to the end face of the optical fiber and the wavelength selecting filter-fixing face. As mentioned above, the oblique angle Θ is 4 to 12 degrees.

The wavelength-selecting filter transmits only the assigned wavelength, which enters the filter at the oblique angle Θ. The optical receiver uses a wavelength-selecting filter having a center wavelength of 1,546.2 nm. The wavelength-selecting filter is produced by vapor-depositing a dielectric multilayer film on a polyimide substrate. The wavelength-selecting filter has a thickness of 100 μm, a length of 1 mm, and a width of 1 mm. An increase in the number of dielectric layers increases the sharpness of the wavelength selectivity. Because the wavelength difference between the neighboring wavelengths is extremely small at 3.2 nm, a multitude of dielectric layers is required, increasing the thickness of the dielectric multilayer film.

Subsequently, the optical pathway-changing groove, the end portion of the optical fiber, and the PD are covered with a silicone-based transparent resin having a refractive index comparable to that of the optical fiber. This resin reduces the reflection of light at the surface of the filter and at the back face of the PD, and protects individual parts.

The assembly process of this optical receiver has various advantages that cannot be obtained by conventional stereoscopic PD modules. The optical receiver can be assembled in a short time by a passive alignment technique, which does not require feeding of electric current and monitoring of optical and electrical signals.

All the parts are aligned in one plane on the Si substrate, and the optical fiber is precisely aligned merely by placing it in the V-shaped groove formed by etching at the precisely determined place. That is, the optical fiber is positioned without fine adjustment. The PD has only to be bonded to the electrode-terminal pattern that has been precisely positioned in advance. This process securely positions the PD to where it can receive all the rays of a light beam emerging from the wavelength-selecting filter.

In comparison with devices produced by the conventional technique, the optical receiver of the present invention can be mounted in a considerably short time, has few parts, and can be produced stably at low cost.

The dimensions of the optical receiver is practically determined by the Si substrate. The optical receiver can be an extremely small device even when all the parts are mounted on the Si substrate because the substrate measures for example, as small as 3 mm in length and 1.5 mm in width. The height can be less than 3 mm even when the thicknesses of the $SiO_2$ layer, the metallized electrode pattern, the PD, and the resin are added to the 1 mm thickness of the Si substrate. When the optical receiver is fixed onto a lead frame, the total thickness is no more than about 4 mm.

The optical receiver produced by the above-described method was subjected to the measurement of wavelength selectivity. When the sensitivity at the center wavelength 1,546.2 nm is expressed as 0 dB, the total width δ of the wavelength at which the sensitivity decreases to −20 dB was about 3 nm (hereinafter δ is referred to as the 20-dB-attenuating wavelength band). This value is determined by the performance of the wavelength-selecting filter. If the wavelength selectivity of the filter is further improved, the 20-dB-attenuating wavelength band δ can be decreased to less than 3 nm. In this embodiment, because the wavelength interval Δ in WDM signals is specified as 3.2 nm, the 20-dB-attenuating wavelength band δ of 3 nm cannot cause optical crosstalk (δ<Δ).

EMBODIMENT 2

Figure 4:
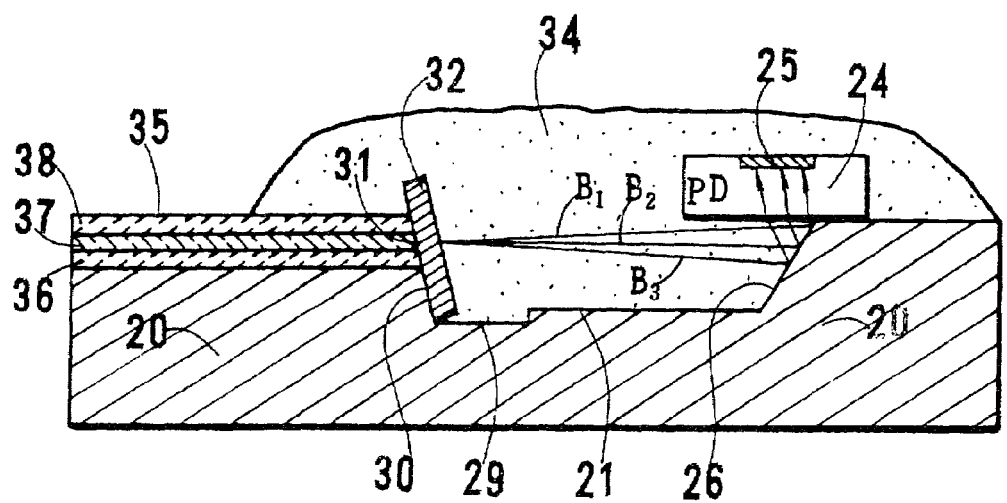
FIG. 4 is a longitudinal cross section of an optical receiver of Embodiment 2 of the present invention.
Figure 5:
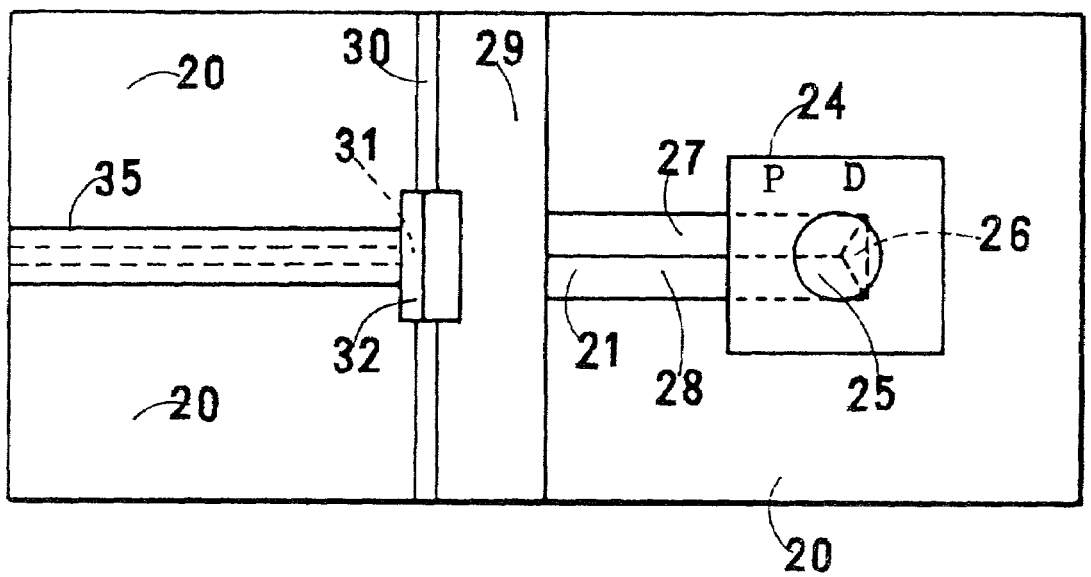
FIG. 5 is a plan view of an optical receiver of Embodiment 2 of the present invention before applying a transparent resin.

FIGS. 4 and 5 show Embodiment 2. Dissimilar to Embodiment 1, an $SiO_2$-based optical waveguide is formed on the Si substrate in place of the optical fiber, and the wavelength-selecting filter is cemented to the end face of the waveguide. Since no optical fiber is used, no V-shaped groove is required. Consequently, no optical fiber-fixing work is required.

An optical pathway-changing groove 21 is provided on the center axis of an Si substrate 20, which has the shape of a rectangular solid. The optical pathway-changing groove 21, provided at the middle portion of the substrate, has three faces: an oblique end face 26 and side faces 27 and 28. These faces are coated with gold, aluminum, or another material to increase the reflectance. A PD 24 is mounted directly above the oblique end face 26. The PD is also a back-illuminated type. A top-illuminated PD may be used by mounting it upside down.

A waveguide 35 is formed from the front end to the center portion of the Si substrate to introduce signals. The waveguide is formed by laminating on the substrate an under-cladding layer 36 made of $SiO_2$, a core 37 having a high refractive index (for example, Ge-doped $SiO_2$), and an over-cladding layer 38 made of $SiO_2$. A lateral groove 29 is formed at the end of the optical waveguide 35. The bottom surface of the lateral groove 29 is not required to be at the same level as that of the bottom line of the optical pathway-changing groove 21. A lateral groove 29 can be formed by either etching or dicing. The lateral groove 29 is provided to form an oblique face, and the wavelength selecting filter-fixing face 30, at the end of the optical waveguide.

A wavelength-selecting filter 32, made of a dielectric multilayer film, is cemented to the oblique end face 31 of the optical waveguide. The end face of an outside optical fiber (not shown) that transmits signals from outside is cemented to the front end of the optical waveguide 35. The end portion of the optical waveguide 35, the wavelength-selecting filter 32, the optical pathway-changing groove 21, and the PD 24 are covered with a transparent resin 34. The Si substrate is fixed to a lead frame, and plastic molding with epoxy resin completes the production of the device.

Light, having multiplexed wavelengths, enters the optical waveguide 35 from the outside optical fiber. The wavelength-selecting filter 32 transmits only the assigned wavelength, reflecting the complementary wavelength. Since the wavelength-selecting filter 32 is in close contact with the end face of the optical waveguide 35, it is unnecessary to rely on a lens or collimator. The wavelength-selecting filter is slanted, therefore the complementary wavelength is dissipated without returning to the optical fiber. Rays B1, B2, and B3 of the beam of the light having the assigned wavelength are reflected at the oblique end face 26 of the optical pathway-changing groove 21, enter the PD 24, reach the photo-sensitive area 25, and are finally converted into photocurrent. The photocurrent is the signal to be received.

The optical waveguide 35 can be formed easily on the Si substrate at the stage of wafer process. Because no optical fiber is used, optical fiber-related work is eliminated after the cutting into chips. As a result, the assembly time is further shortened.

EMBODIMENT 3

Figure 6:
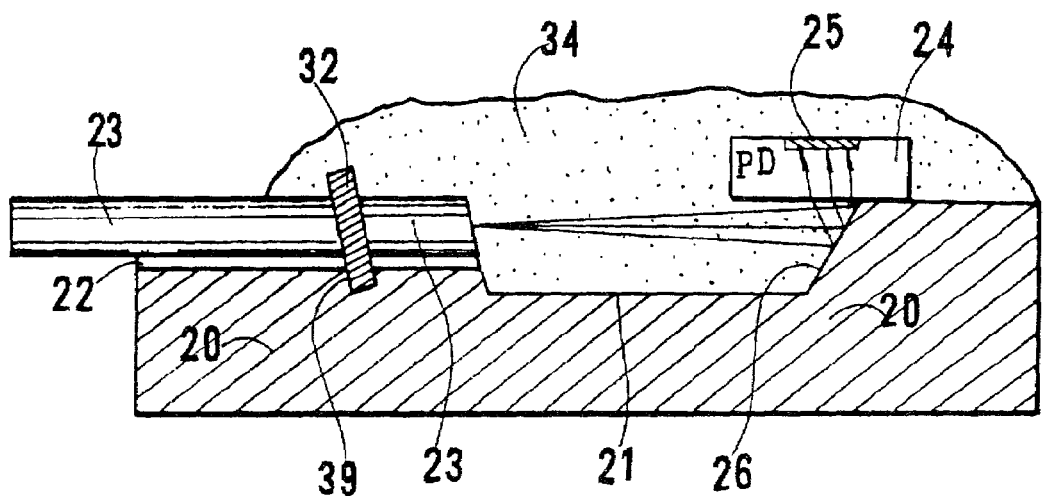
FIG. 6 is a longitudinal cross section of an optical receiver of Embodiment 3 of the present invention.
Figure 7:
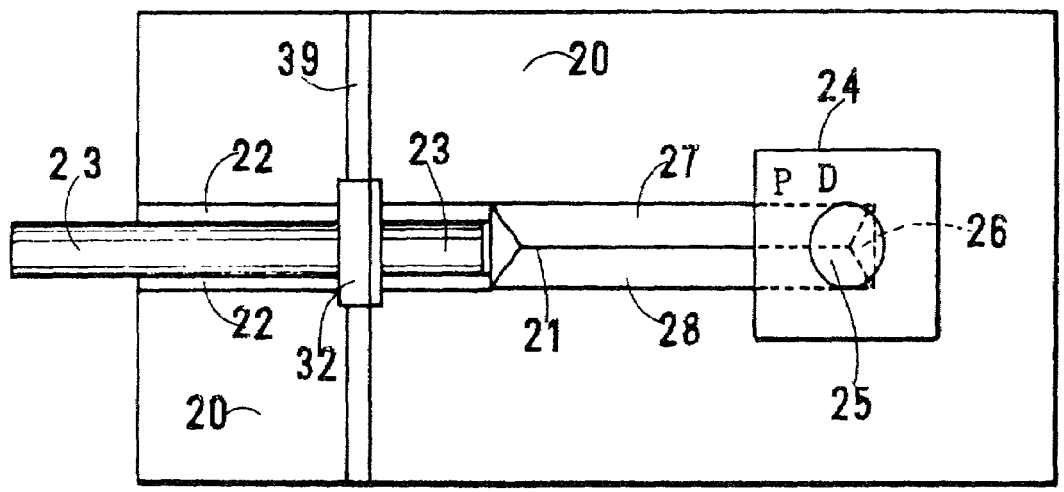
FIG. 7 is a plan view of an optical receiver of Embodiment 3 of the present invention before applying a transparent resin.

FIGS. 6 and 7 show Embodiment 3. As is the case with Embodiment 1, a V-shaped groove is provided on an Si substrate to fix an optical fiber. An oblique space is provided at the midpoint of the optical fiber, and a wavelength-selecting filter is inserted into the space.

An optical pathway-changing groove 21 and a V-shaped groove 22 are provided on the center axis of a substrate 20, which has the shape of a rectangular solid. The optical pathway-changing groove 21 is coated with metal to increase the reflectance. A PD 24 is mounted directly above the oblique end face 26. An optical fiber 23 is placed in the V-shaped groove 22 formed from the front end to the center portion of the substrate and fixed there. The end face of the optical fiber is obliquely polished to prevent the reflected light from returning to an LD. An oblique wavelength selecting filter-fixing groove 39 is provided by cutting orthogonally to the axis of the optical fiber at the midpoint of the optical fiber. During this machining process, the optical fiber is severed concurrently. A wavelength-selecting filter 32 is inserted into this cut portion and fixed. The wavelength-selecting filter 32, the optical pathway-changing groove 21, and the PD 24 are covered with a transparent resin 34. The substrate is fixed to a lead frame, and the electrode terminals and leads are connected by wire bonding. Plastic molding with, for example, epoxy resin completes the production of the device.

Dissimilar to Embodiment 1, the wavelength-selecting filter is inserted into the midpoint of the optical fiber, unattached to its end face. Although the wavelength selectivity is unchanged, the insertion of the wavelength-selecting filter into the midpoint of the optical fiber assures increased stability. When the filter has a thickness of 50 μm, the wavelength selecting filter-fixing groove is designed to have a width of 55 to 60 μm. When the filter has a thickness of 100 μm, the groove is designed to have a width of 105 to 110 μm. After the insertion of the wavelength-selecting filter, the gaps between the filter and the optical fiber and between the filter and the groove are filled with a transparent resin having a refractive index comparable to that of the optical fiber.

Figure 14:
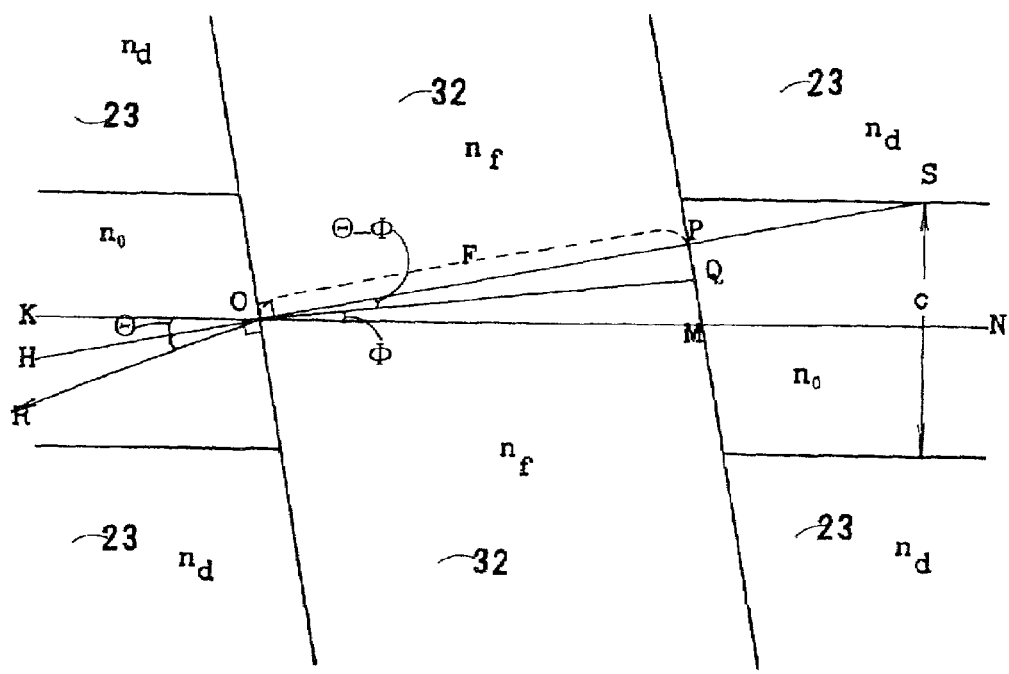
FIG. 14 is an illustration explaining that when a wavelength-selecting filter is inserted obliquely into a midpoint of an optical fiber, the refracted light reverts to core-propagating light.

FIG. 14 is an enlarged view of the place where a wavelength-selecting filter having a thickness of F and a refractive index of $n_f$ is inserted into the midpoint of a single-mode optical fiber 23 having a core whose diameter is c and whose refractive index is $n_0$ at the oblique angle Θ. This figure is used to calculate the amount of the deviation of a beam of light after passing through the filter. The beam proceeds from the left to the right. Line KOMN signifies the axis of the optical fiber. The beam having proceeded in the direction of KO enters the filter at the center point O of the end face of the optical fiber and is refracted in the direction OQ. The normal line at the boundary is denoted in HOPS. Point P is the intersection between the normal line and the other face of the filter. Line OP, whose length is F, shows the thickness of the filter 32.

When the beam having proceeded in the direction KO in the core is reflected at boundary point O (the complementary wavelength is reflected at the filter), the reflected beam proceeds in direction OR. Since the angle between line OR and the optical axis is 2Θ, the reflected beam penetrates the cladding and dissipates. The refracted beam proceeds in direction OQ. When angle KOH is denoted in Θ, and angle QOM in Φ, angle POQ is expressed in Θ-Φ. Snell's law gives the following relationship:

$$n_0 \sin \Theta = n_f \sin(\Theta-\Phi) \qquad (7).$$

Hence, $$\Phi = -\sin^{-1}(n_0 \sin \Theta/n_f) + \Theta \qquad (8).$$

The optical fiber is known to have a refractive index of $n_0$=1.46. Because the total refractive index of the filter is not known precisely, the refractive index (1.52) of the polyimide substrate, which constitutes the principal part of the filter, is used as the total refractive index $n_f$=1.52. Consequently, the values of Φ for Θ=4 degrees, Θ=8 degrees, and Θ=12 degrees are obtained as follows:

$$\Phi(4 \text{ degrees}) = 0.158 \text{ degrees} \qquad (9).$$

$$\Phi(8 \text{ degrees}) = 0.318 \text{ degrees} \qquad (10)$$

$$\Phi(12 \text{ degrees}) = 0.480 \text{ degrees} \qquad (11).$$

Even when the filter is supposed to have a thickness, F, of 100 μm, deviation MQ of the beam from the axis of the core is no more than 0.27 μm for Θ=4 degrees, 0.56 μm for Θ=8 degrees, and 0.84 μm for Θ=12 degrees. Because the core has a radius of 5 μm, the beam having entered the filter at point O reaches the other end of the filter, Q, with a negligible amount of deviation from the axis of the core, MN. In other words, a beam of light having an assigned wavelength can propagate through the optical fiber even after passing through the wavelength-selecting filter.

The values given by equations (9), (10), and (11) obtained by the above consideration can be used for correcting the angle of incidence to the obliquely inserted filter. Therefore, it is desirable that the thickness of the dielectric multilayer film that forms the filter be determined by correcting the angle Θ using the foregoing values in terms of strict design.

EMBODIMENT 4

Figure 8:
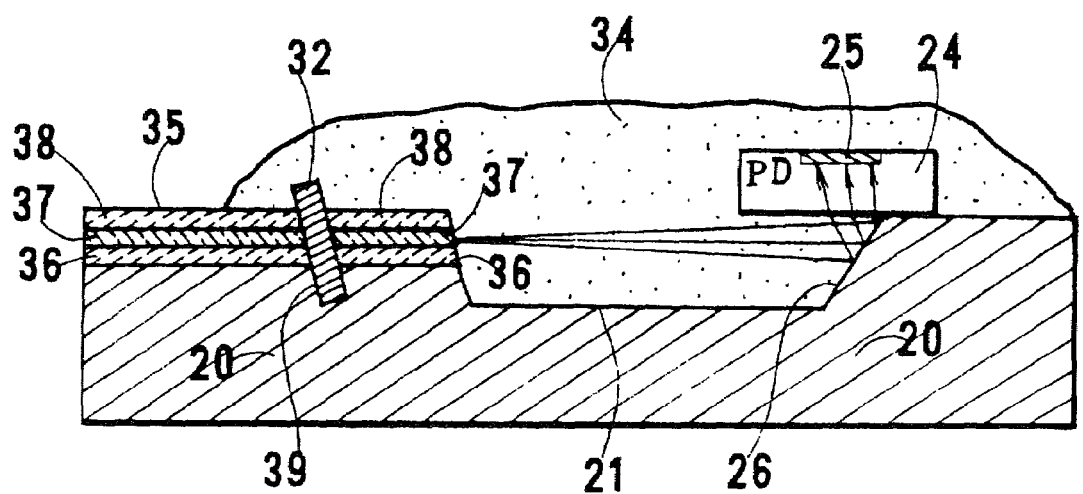
FIG. 8 is a longitudinal cross section of an optical receiver of Embodiment 4 of the present invention.
Figure 9:
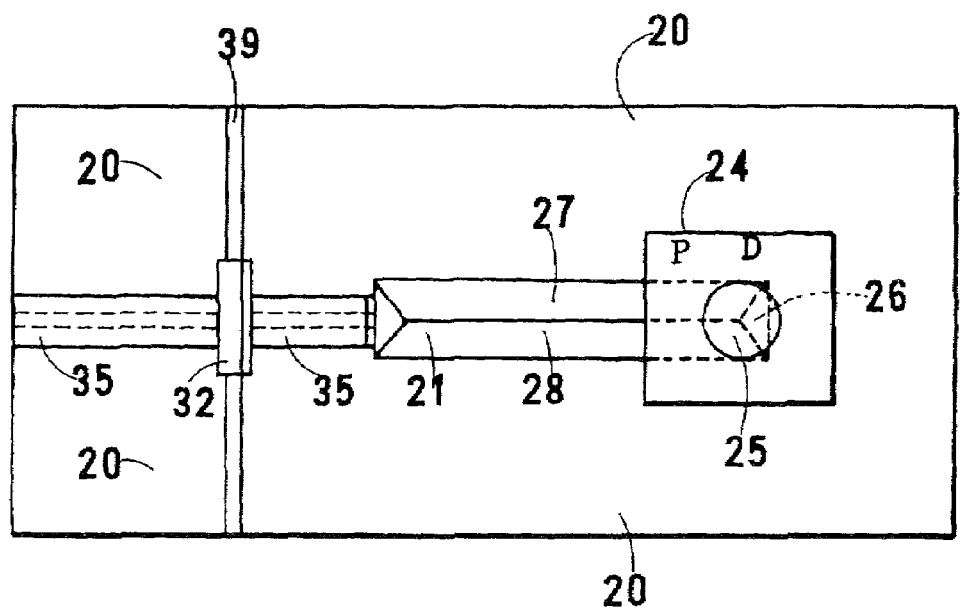
FIG. 9 is a plan view of an optical receiver of Embodiment 4 of the present invention before applying a transparent resin.

FIGS. 8 and 9 show Embodiment 4. As with Embodiment 2, an optical waveguide 35 is formed on a substrate 20, an optical pathway-changing groove 21 is provided on the axis of the substrate, and a PD 24 is mounted directly above the oblique end face 26 of the groove. A wavelength selecting filter-fixing groove 39 is formed by machining at the midpoint of the optical waveguide 35 in the direction perpendicular to the axis of the waveguide. The groove 39 has a 4- to 12-degree slant toward the front. A wavelength-selecting filter 32 is inserted into the groove 39 at the place where the waveguide is severed, and the filter is fixed there. The PD 24, the optical pathway-changing groove 21, the wavelength-selecting filter 32, and the end portion of the optical waveguide are covered with a transparent resin 34. The substrate is fixed to a lead frame, and the electrode terminals on the substrate and leads are connected by wire bonding. Plastic molding completes the production of the device.

In this embodiment, the oblique wavelength selecting filter-fixing groove 39 is formed at the midpoint of the waveguide 35 and the wavelength-selecting filter 32 is inserted into the groove 39. Dissimilar to Embodiment 2, the filter is inserted into the midpoint of the optical waveguide, unattached to its end face. The insertion of the filter into the midpoint of the optical waveguide assures increased stability. When the filter has a thickness of 50 μm, the filter-fixing groove is designed to have a width of 55 to 60 μm. When the filter has a thickness of 100 μm, the groove is designed to have a width of 105 to 110 μm. After the insertion of the filter, the gaps between the filter and the optical waveguide and between the filter and the groove are filled with a transparent resin having a refractive index comparable to that of the optical waveguide. These procedures are similar to those in Embodiment 3.

Incoming light, having WDM signals, from the outside optical fiber enters the optical waveguide 35. The wavelength-selecting filter 32 transmits only the assigned wavelength $\lambda_j$, reflecting the complementary wavelength. Since the filter is slanted, the complementary wavelength is reflected obliquely and dissipated without returning to the original pathway. Light having the assigned wavelength emerges from the end face of the optical waveguide 35, enters the optical pathway-changing groove 21, is reflected at the oblique end face 26, and enters the PD 24. The PD detects only the assigned wavelength $\lambda_j$.

EMBODIMENT 5

Figure 10:
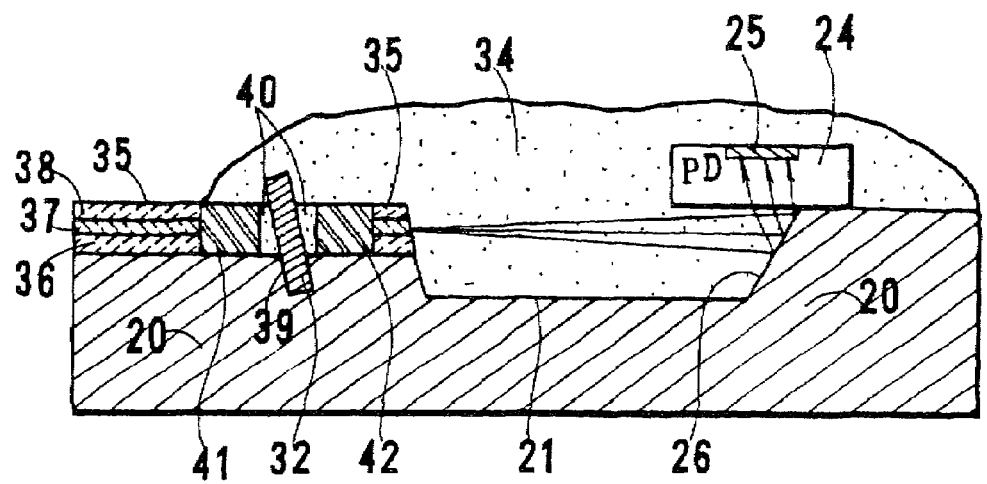
FIG. 10 is a longitudinal cross section of an optical receiver of Embodiment 5 of the present invention.
Figure 11:
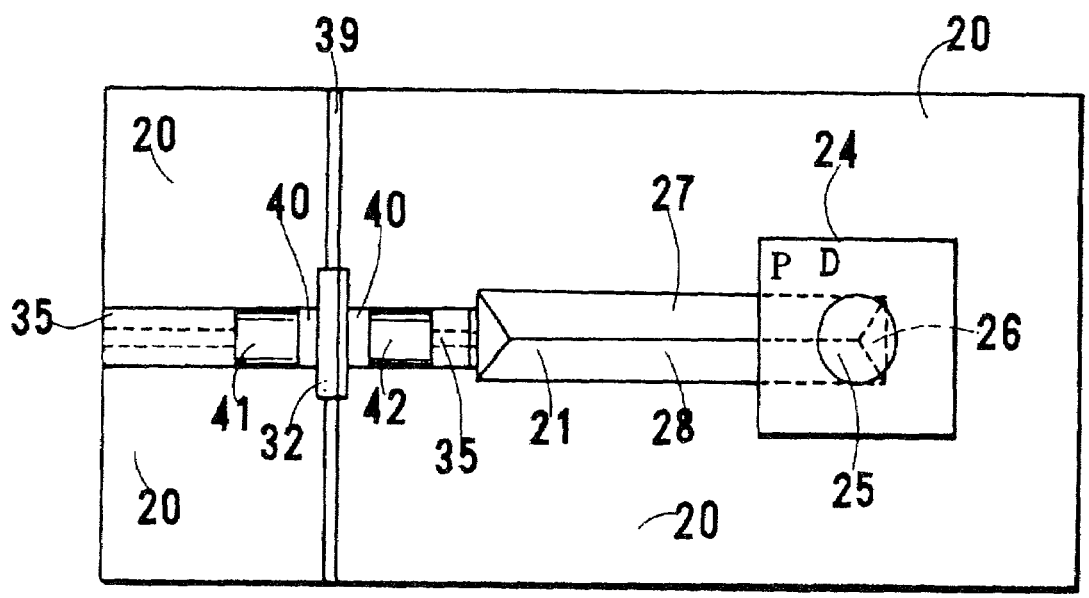
FIG. 11 is a plan view of an optical receiver of Embodiment 5 of the present invention before applying a transparent resin.

FIGS. 10 and 11 show Embodiment 5. As with embodiments hitherto explained, an optical waveguide 35 is formed on a substrate 20, an optical pathway-changing groove 21 is provided on the axis of the substrate, and a PD 24 is mounted directly above the oblique end face 26 of the groove. A wavelength selecting filter-fixing groove 39 is formed by machining at the midpoint of the optical waveguide 35 in the direction perpendicular to the axis of the waveguide. The groove 39 has a 4- to 12-degree slant toward the front. Some length of the optical waveguide 35 is shaved partly so that the removed portion includes at its center the wavelength selecting filter-fixing groove 39. As a result, spaces 40 are formed in front of and behind the groove 39. A wavelength-selecting filter 32 is securely inserted into the groove 39 at the place where the core is separated into two parts. A collimator 41 is inserted into the space between the filter 32 and the optical waveguide 35 in front of the filter; an inverse collimator 42, into the space between the filter 32 and the optical waveguide 35 behind the filter. Although this embodiment is similar to the prior art with respect to both having a collimator and an inverse collimator, those used in this embodiment are sufficiently small. They are used to obtain a parallel beam of light before the wavelength selection. A collimator and an inverse collimator can be used for increasing wavelength resolution so that the assigned wavelength can be selected from the increased number of wavelengths. The present invention can be applied to such a combination.

The PD 24, the optical pathway-changing groove 21, the wavelength-selecting filter 32, the collimator 41, the inverse collimator 42, and the end portion of the optical waveguide 35 are covered with a transparent resin 34. The substrate is fixed to a lead frame, and the electrode terminals on the substrate and leads are connected by wire bonding. Plastic molding completes the production of the device.

In this embodiment, a collimating system is used at both sides of the wavelength-selecting filter in addition to the structure used in Embodiment 4. The structure in this embodiment can be applied to actual use without sacrificing the excellent features of the present invention: small size and low cost.

EMBODIMENT 6

Figure 12:
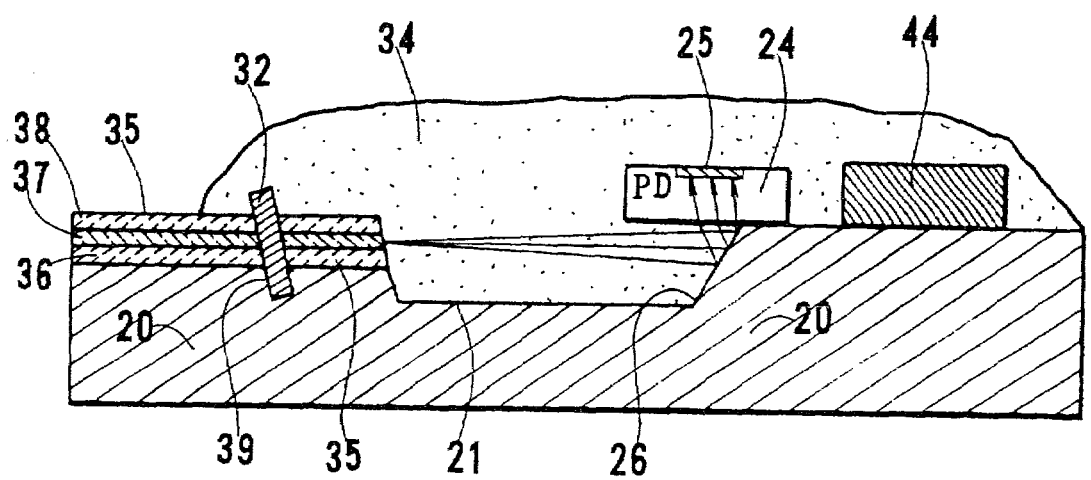
FIG. 12 is a longitudinal cross section of an optical receiver of Embodiment 6 of the present invention.
Figure 13:
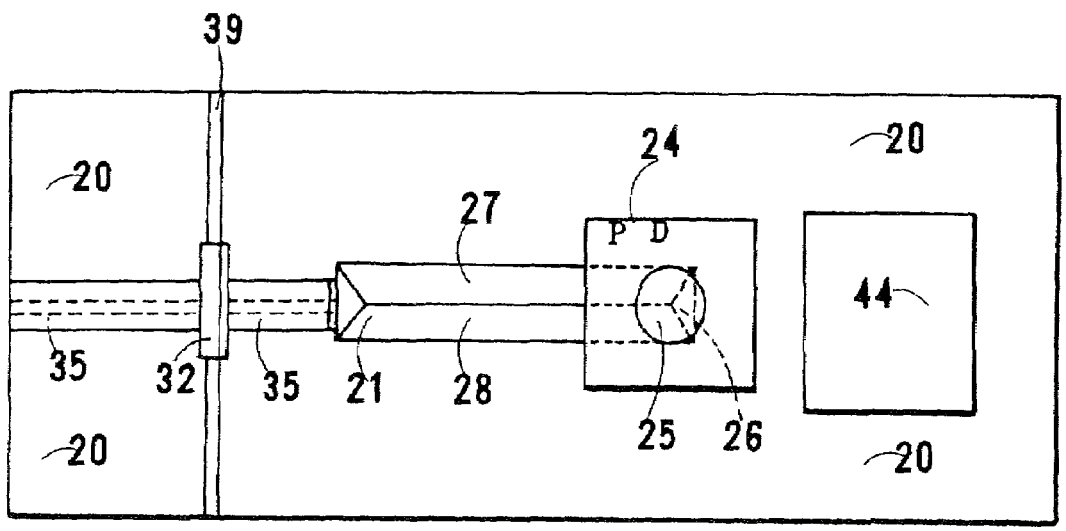
FIG. 13 is a plan view of an optical receiver of Embodiment 6 of the present invention before applying a transparent resin.

FIGS. 12 and 13 show Embodiment 6. As with embodiments explained thus far, an optical waveguide 35 is formed on a substrate 20, an optical pathway-changing groove 21 is provided on the axis of the substrate, and a PD 24 is mounted directly above the oblique end face 26 of the groove. In addition, an amplifier 44 is provided on the substrate to amplify the signals of the PD 24. Immediate amplification of a fast-changing weak photocurrent can notably reduce the influence of noise from outside. As with Embodiment 4, a wavelength selecting filter-fixing groove 39 is formed by machining at the midpoint of the optical waveguide 35 in the direction perpendicular to the axis of the substrate. The groove 39 has a 4- to 12-degree slant toward the front. A wavelength-selecting filter 32 is securely inserted into the groove 39, so that the core of the optical waveguide 35 is separated into the front part and the rear part.

As with Embodiment 4, the optical waveguide 35 is formed on the Si substrate 20, and the wavelength-selecting filter 32 is placed at the midpoint of the optical waveguide 35. In this embodiment, the amplifier 44 is mounted on the Si substrate 20 to amplify the signals in the form of photocurrent generated by the PD 24. Since the signals are immediately amplified, noise levels can notably be reduced. As a result, wavelength selectivity is further sharpened at both ends of the sensitivity-wavelength curve, reducing the possibility of overlapping with the neighboring wavelength band. It is effective to use the combination of an InGaAs-based PD and an amplifier made with a GaAs-based IC or an Si-base IC.

EMBODIMENT 7

Figure 15:
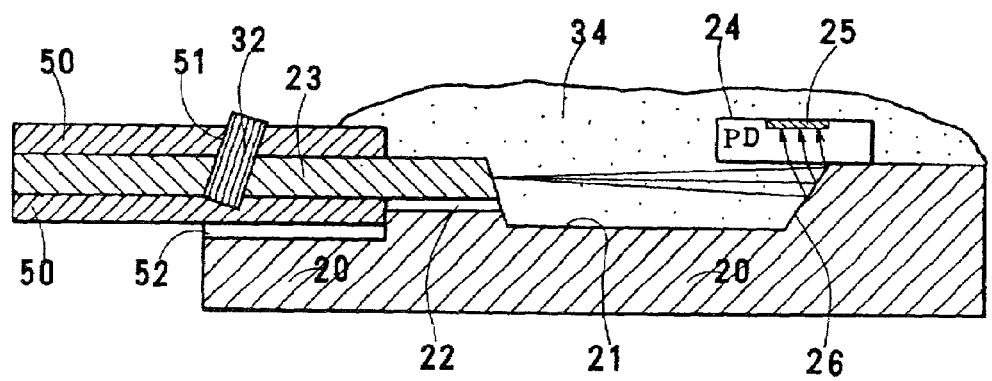
FIG. 15 is a longitudinal cross section of an optical receiver of Embodiment 7 of the present invention.
Figure 16:
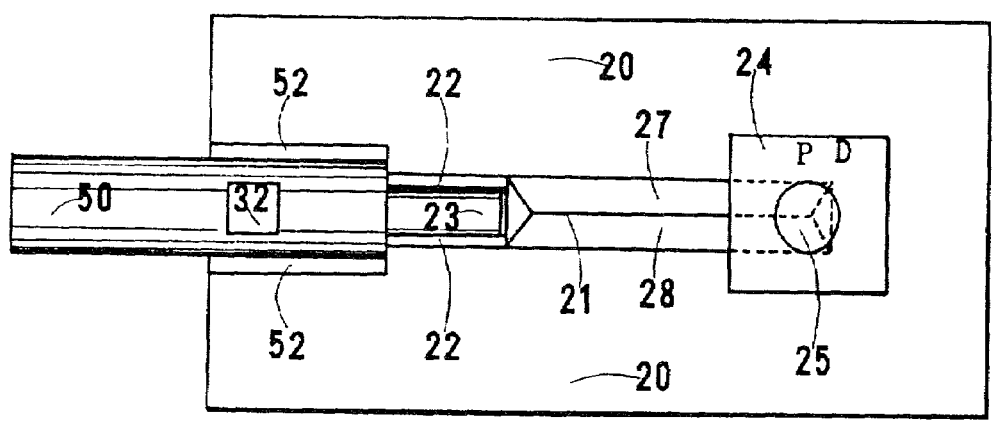
FIG. 16 is a plan view of an optical receiver of Embodiment 7 of the present invention before applying a transparent resin.

When an optical fiber is used as the light-transmitting medium, the optical fiber can be inserted into a cylindrical ferrule. When an optical fiber and a ferrule are unified, this unit is called a ferruled optical fiber. The optical fiber comprises a core having a diameter of 10 μm and a cladding having a diameter of 125 μm. The ferrule is a cylindrical member with an inside diameter of 125 μm and is made of metal, ceramic, or other material. In this embodiment, a ferruled optical fiber is used as the light-transmitting medium and is fixed on a substrate as shown in FIGS. 15 and 16.

A V-shaped groove 22 is provided on a rectangular solid-shaped substrate 20 made of Si or ceramic. The groove is provided in the direction of the center axis of the substrate, and a larger V-shaped groove 52 is provided between the V-shaped groove 22 and the front end of the substrate. On the center axis of the substrate, an optical pathway-changing groove 21 is provided behind the V-shaped groove 22. Consequently, the larger V-shaped groove 52, the V-shaped groove 22, and the optical pathway-changing groove 21 are aligned in this order on the center axis. The optical pathway-changing groove 21 has an oblique end face 26 at the other end. These grooves can be formed by anisotropic etching when an Si substrate is used and be molded by a mold when a plastic or ceramic substrate is used. When a metal substrate is used, these grooves can be formed by mechanical cutting. A metal substrate requires an insulating layer.

A wiring pattern is formed on the top surface of the substrate 20 by printing, vapor-depositing, spattering, or another method. A PD 24 is fixed on the substrate surface above the oblique end face 26. The PD is a back-illuminated type. The PD 24 is fixed such that it straddles the end portion of the optical pathway-changing groove 21. The substrate 20 is fixed to a lead frame, and the connections between the PD's electrodes and the wiring pattern and between the wiring pattern and the leads are done by wire bonding.

An optical fiber 23 is securely inserted into a cylindrical ferrule 50. This embodiment uses a ferruled optical fiber in which the optical fiber 23 and the ferrule 50 are unified in advance. In one type of ferruled optical fiber, the optical fiber is flush with the ferrule at one end; in another type, the optical fiber protrudes from the ferrule at both ends. This embodiment uses the former type. The protruding end of the optical fiber is polished obliquely to prevent the reflected light from returning to the original pathway.

A filter-supporting hole 51 is provided at the midpoint of the ferruled optical fiber. A wavelength-selecting filter 32 is inserted into this hole. Although not required to pass through the ferrule 50, the hole must be provided such that it intersects the optical fiber 23. The filter, made of a dielectric multilayer film, transmits only the assigned wavelength, reflecting the other wavelengths. The filter is slanted slightly to the plane perpendicular to the axis.

A ferruled optical fiber thus prepared in advance is placed on the substrate 20. The ferrule 50 is placed in the larger V-shaped groove 52 and fixed; the optical fiber 23 is placed in the V-shaped groove 22 and fixed. The end portion of the optical fiber 23, the optical pathway-changing groove 21, and the PD 24 are covered with a transparent resin 34 using the encapsulation method. The lead frame with the substrate may either be housed in a package such as a ceramic, plastic, or metal package or be plastic-molded with epoxy resin.

The optical fiber 23 in the ferrule 50 is connected to the outside optical fiber through an optical connector. Although signal-laden light having propagated through the outside optical fiber has a multitude of wavelengths, the wavelength-selecting filter transmits only the assigned wavelength. Light having the assigned wavelength emerges from the optical fiber 23, passes through the optical pathway-changing groove 21, is reflected at the oblique end face 26, and enters the PD 24. The PD generates photocurrent at a photo-sensitive area 25. This function is similar to that in other embodiments such as Embodiment 1.

In this embodiment, the wavelength-selecting filter is attached to the ferruled optical fiber in advance. It is therefore unnecessary to carry out the groove processing and filter insertion after the fixation of the optical fiber onto the Si substrate. This structure provides higher productivity and is mechanically stronger than that produced without using a ferrule.

EMBODIMENT 8

Figure 17:
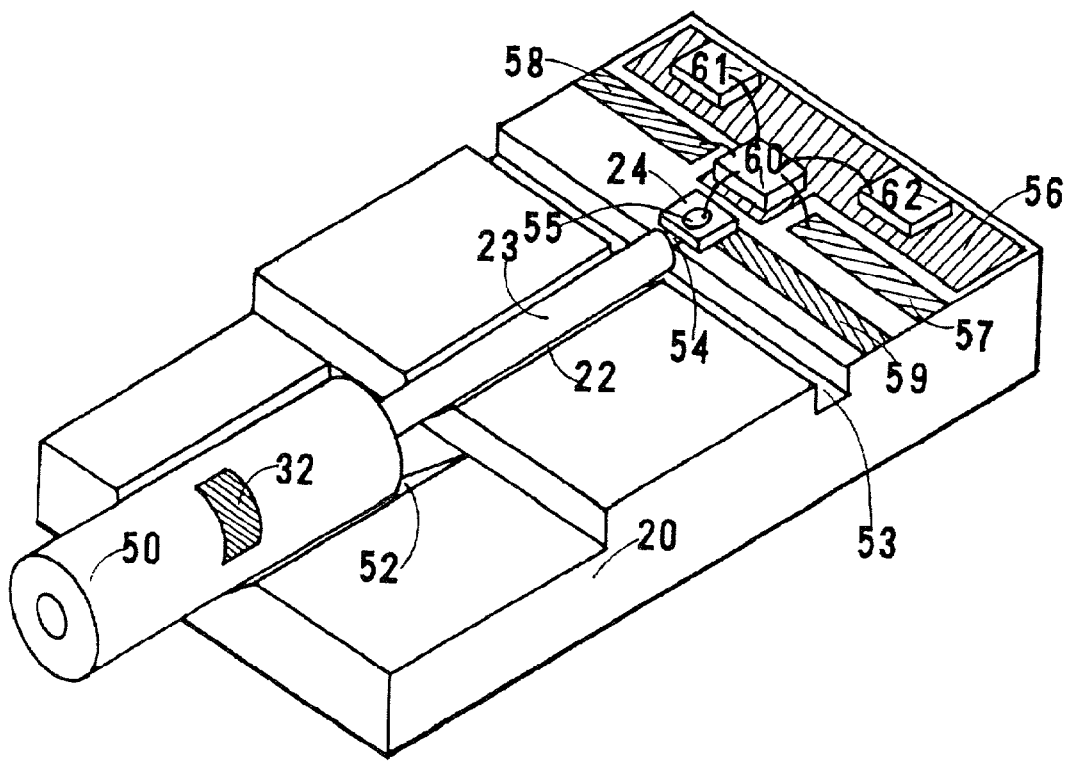
FIG. 17 is a perspective view of the substrate portion of an optical receiver of Embodiment 8 of the present invention.

This embodiment, also, uses a ferruled optical fiber, in which an optical fiber is inserted into a ferrule. A wavelength-selecting filter is securely inserted in advance into a filter-supporting hole provided in the ferruled optical fiber. FIG. 17 is a perspective view showing the internal structure of an optical receiver of this embodiment.

A rectangular solid-shaped substrate 20 made of Si or ceramic is formed such that it has two platforms: a low front platform and a high rear platform. A V-shaped groove 22 is provided on the center axis of the front half of the high rear platform. A larger V-shaped groove 52 is provided on the center axis of the low front platform. A short, narrow optical pathway-changing groove 54 is provided, in alignment, behind the V-shaped groove 22. A lateral groove 53 is formed such that it orthogonally crosses the optical pathway-changing groove 54. The lateral groove 53 determines the end position of the optical fiber. The optical pathway-changing groove 54 has an oblique end face.

Wiring patterns 56 to 59 are formed on the top surface of the substrate 20 by printing, vapor-deposition, sputtering, or another method. The wiring patterns are more complicated than the pattern in Embodiment 7 because an amplifier 60 is to be provided in this embodiment. A PD 24 is fixed to the wiring pattern 59 on the substrate surface above the oblique end face of the optical pathway-changing groove 54. The PD, also, is a back-illuminated type. An amplifier 60 is mounted onto a grounding wiring pattern 56 behind the PD 24. Flat-type capacitors 61 and 62 are fixed to the rear portion of the grounding wiring pattern 56. A p electrode 55 of the PD 24 is connected to an input terminal of the amplifier 60 with a wire. Power-source terminals of the amplifier 60 are connected to upper electrodes of the capacitors 61 and 62 with wires. An output terminal of the amplifier 60 is connected to the wiring pattern 58 with a wire. A power-source pad of the amplifier 60 is connected to the wiring pattern 57 with a wire. The substrate 20 is fixed onto a lead frame 63 (see FIG. 19). Leads and the wiring patterns are connected by wire bonding.

An optical fiber 23 of a ferruled optical fiber is securely inserted into a cylindrical ferrule 50. A filter-supporting hole is provided at a midpoint of the ferruled optical fiber. A wavelength-selecting filter 32 is inserted into this hole. Although not required to pass through the ferrule 50, the hole must be provided such that it intersects the optical fiber 23. The filter transmits only the assigned wavelength, reflecting the other wavelengths.

Figure 18:
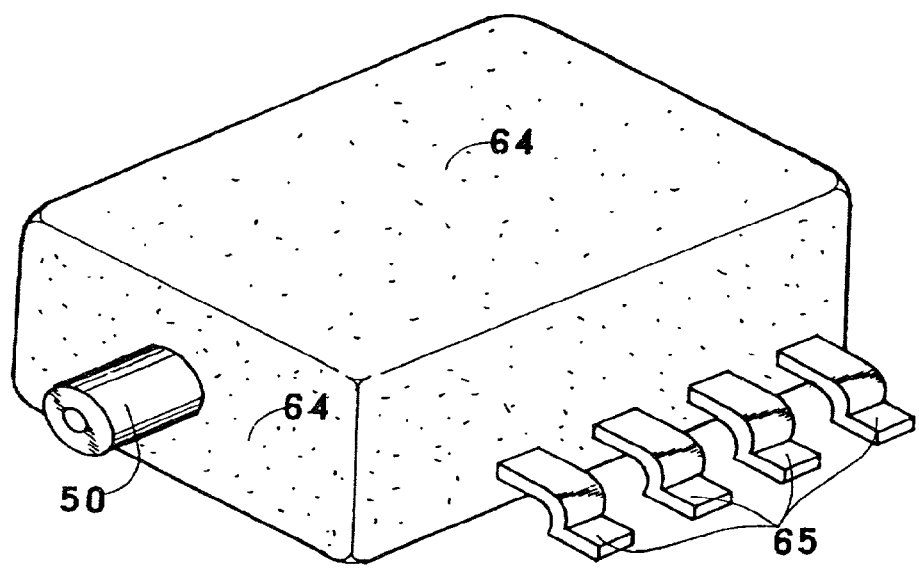
FIG. 18 is a perspective view of an optical receiver of Embodiment 8 of the present invention after it is packaged.
Figure 19:
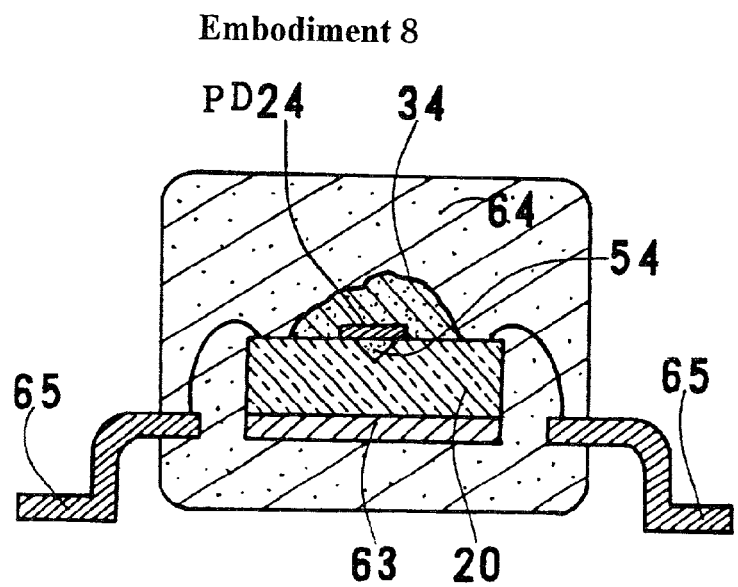
FIG. 19 is a transverse cross section of an optical receiver of Embodiment 8 of the present invention after it is packaged.

A ferruled optical fiber thus prepared in advance is placed on the substrate 20. The ferrule 50 is placed in the larger V-shaped groove 52 and fixed; the optical fiber 23 is placed in the V-shaped groove 22 and fixed. The end portion of the optical fiber 23, the optical pathway-changing groove 54, and the PD 24 are covered with a transparent resin 34 (see FIG. 19) using the encapsulation method. The lead frame with the substrate is plastic-molded with epoxy resin. FIG. 19 shows this structure in a transverse cross section. FIG. 18 is a perspective view showing that the principal parts are encapsulated in a plastic mold package 64. Lead pins 65 protrude in parallel from both sides. The ferrule 50 housing the optical fiber protrudes from the front end.

The optical fiber in the ferrule 50 is connected to the outside optical fiber through an optical connector. Although signal-laden light having propagated through the outside optical fiber has a multitude of wavelengths, the wavelength-selecting filter transmits the assigned wavelength only. Light having the assigned wavelength emerges from the optical fiber 23, passes through the optical pathway-changing groove 54, is reflected at the oblique end face, and enters the PD 24. The PD generates photocurrent at the photo-sensitive area. The photocurrent is amplified by the amplifier 60 placed in the vicinity of the PD. Amplified low-impedance signals are sent out to the outside circuit. This device has the advantages of high sensitivity and noise resistance.

EMBODIMENT 9

Figure 20:
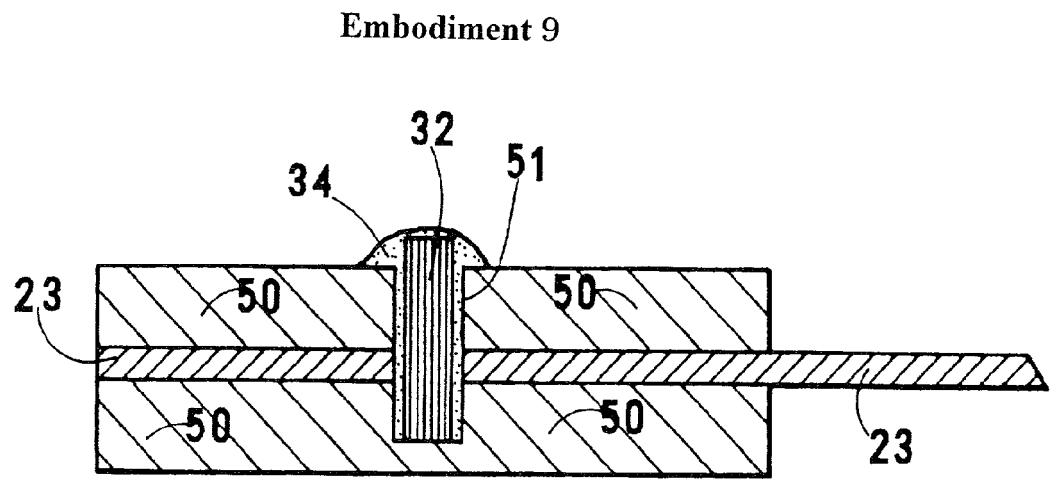
FIG. 20 is a longitudinal cross section of a ferruled optical fiber used in an optical receiver of Embodiment 9 of the present invention.

This embodiment, also, uses a ferruled optical fiber, in which an optical fiber is inserted into a ferrule. A wavelength-selecting filter is securely inserted in advance into a filter-supporting hole provided in the ferruled optical fiber. The mounting structure for the ferrule and optical fiber is similar to that in embodiments described thus far. This embodiment improves the ferruled optical fiber, and only this improvement is explained here. FIG. 20 is a longitudinal cross section of the improved portion.

Whereas Embodiment 7 provides no gaps between the wavelength-selecting filter and the filter-supporting hole, this embodiment provides gaps between the two. A filter-supporting hole 51 is provided in a ferrule 50 perpendicular to the axis of the ferrule. First, a transparent resin 34 having a refractive index comparable to that of an optical fiber 23 is poured into the hole. Next, a wavelength-selecting filter 32 is inserted into the hole, with the gaps filled with the resin. The resin prevents a beam of light emerging from the optical fiber from spreading out and eliminates reflection at the end faces of the optical fiber and filter. If reflection is eliminated completely from the optical fiber and filter, no light beam returns to the original pathway. This condition allows the filter to intersect the axis orthogonally.

EMBODIMENT 10

Figure 21:
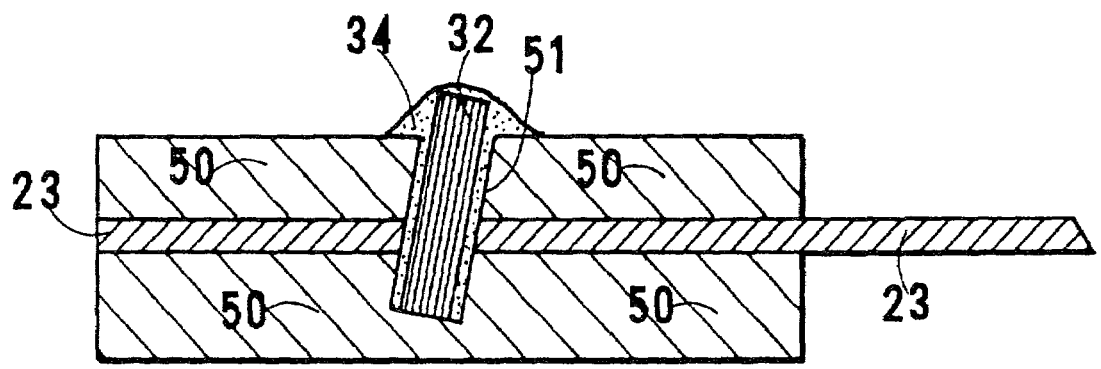
FIG. 21 is a longitudinal cross section of a ferruled optical fiber used in an optical receiver of Embodiment 10 of the present invention.

This embodiment, also, uses a ferruled optical fiber, in which an optical fiber is inserted into a ferrule. FIG. 21 shows a longitudinal cross section of this portion. A wavelength-selecting filter 32 is securely inserted in advance into a slightly oblique filter-supporting hole 51 provided in the ferruled optical fiber. The mounting structure for the ferrule 50 and optical fiber 23 is similar to that in embodiments described thus far. This embodiment further improves the ferruled optical fiber, and only this improvement is explained here. Whereas Embodiment 9 provides a filter-supporting hole that intersects the axis orthogonally, this embodiment provides a filter-supporting hole that intersects the axis obliquely. As with Embodiment 9, this embodiment provides gaps between the filter and the hole. First, a transparent resin 34 having a refractive index comparable to that of the optical fiber is poured into the oblique hole. Next, a wavelength-selecting filter 32 is inserted into the hole and fixed, with the gaps filled with the resin. The resin prevents a beam of light emerging from the optical fiber from spreading out and eliminates reflection at the end faces of the optical fiber and filter.

EMBODIMENT 11

Figure 22:
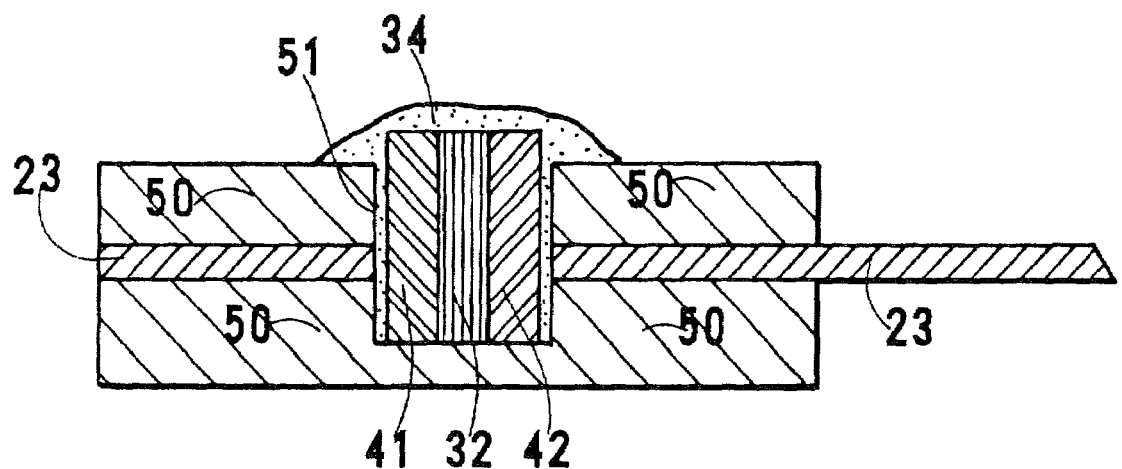
FIG. 22 is a longitudinal cross section of a ferruled optical fiber used in an optical receiver of Embodiment 11 of the present invention.

FIG. 22 is a longitudinal cross section of a ferruled optical fiber used in this embodiment. In the ferruled optical fiber, an optical fiber is integrated with a ferrule. This embodiment uses a collimator-integrated wavelength-selecting filter, in which a wavelength-selecting filter 32, a collimator 41 placed in front of the filter, and an inverse collimator 42 placed behind the filter are integrated into a single unit. A filter-supporting hole 51 is provided in a ferruled optical fiber perpendicular to the axis of the fiber. As with Embodiment 10, this embodiment provides gaps between the collimator-integrated wavelength-selecting filter and the hole. First, a transparent resin 34 having a refractive index comparable to that of an optical fiber 23 is poured into the hole. Next, the collimator-integrated filter is inserted into the hole, with the gaps filled with the resin. The top of the collimator-integrated filter protrudes slightly from the ferrule 50. The resin prevents a beam of light emerging from the optical fiber from spreading out and eliminates reflection at the end faces of the optical fiber and the collimator-integrated filter.

If there is the slightest difference in refractive index between the transparent resin 34 and the optical fiber 23, a beam of light emerging from the optical fiber spreads out in the resin. In this embodiment, however, the collimator 41 converts the divergent beam into a parallel beam. The parallel beam enters the wavelength-selecting filter 32. The filter rejects the complementary wavelength, transmitting only the assigned wavelength. The inverse collimator 42 converts the parallel beam into a convergent beam. The convergent beam enters the optical fiber.

The number of layers and the layer thicknesses of the dielectric layers in the wavelength-selecting filter 32 are designed by assuming a parallel beam. Consequently, a divergent or convergent beam causes an error. This embodiment eliminates this type of error because a parallel beam enters the filter.

EMBODIMENT 12

Figure 23:
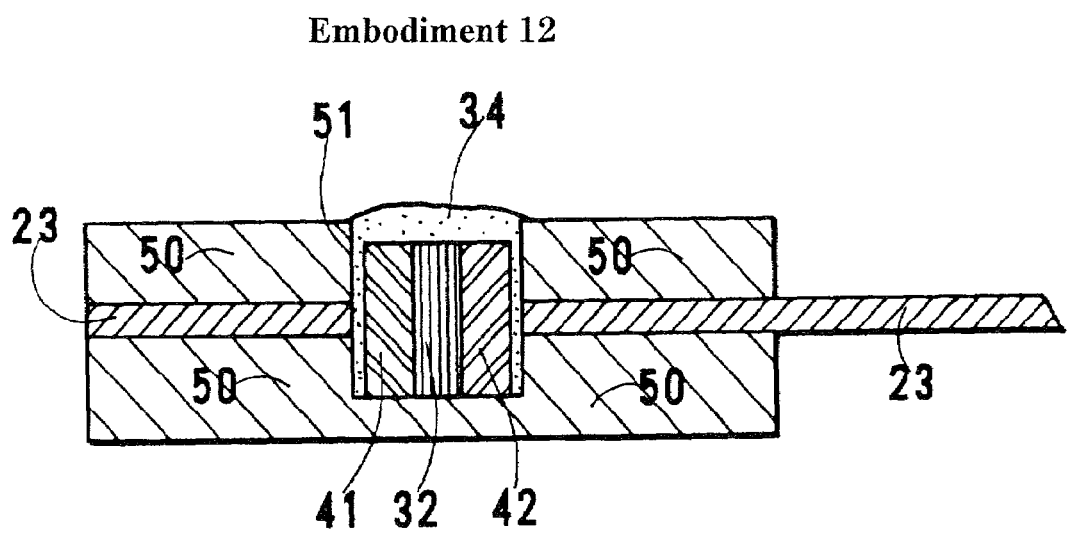
FIG. 23 is a longitudinal cross section of a ferruled optical fiber used in an optical receiver of Embodiment 12 of the present invention.

This embodiment, also, uses a collimator-integrated wavelength-selecting filter, in which a wavelength-selecting filter 32, a collimator 41 placed in front of the filter, and an inverse collimator 42 placed behind the filter are integrated into a single unit. Unlike Embodiment 11, the collimator-integrated wavelength-selecting filter is low in height, so the collimator-integrated filter is buried in a ferrule. This structure is shown in FIG. 23.

This embodiment, also, uses a ferruled optical fiber, in which an optical fiber 23 is integrated with a ferrule 50. A filter-supporting hole 51 is provided in the ferruled optical fiber perpendicular to the axis of the fiber. As with Embodiment 11, this embodiment provides gaps between the collimator-integrated filter and the hole. First, a transparent resin 34 having a refractive index comparable to that of the optical fiber is poured into the hole. Next, the collimator-integrated filter is inserted into the hole. Being low in height, the top of the collimator-integrated filter is below the surface of the ferrule. The resin fills the gaps and covers the top of the collimator-integrated filter. The resin prevents a beam of light emerging from the optical fiber from spreading out and eliminates reflection at the end faces of the optical fiber and the collimator-integrated filter.

If there is the slightest difference in refractive index between the transparent resin 34 and the optical fiber 23, a beam of light emerging from the optical fiber spreads out in the resin. In this embodiment, however, the collimator 41 converts the divergent beam into a parallel beam. The parallel beam enters the wavelength-selecting filter 32. The filter rejects the complementary wavelength, e transmitting only the assigned wavelength. The inverse collimator 42 converts the parallel beam into a convergent beam. The convergent beam enters the optical fiber.

The number of layers and the layer thicknesses of the dielectric layers in the wavelength-selecting filter 32 are designed by assuming a parallel beam. Consequently, a divergent or convergent beam causes an error. This embodiment eliminates this type of error because a parallel beam enters the filter.

EMBODIMENT 13

Figure 24:
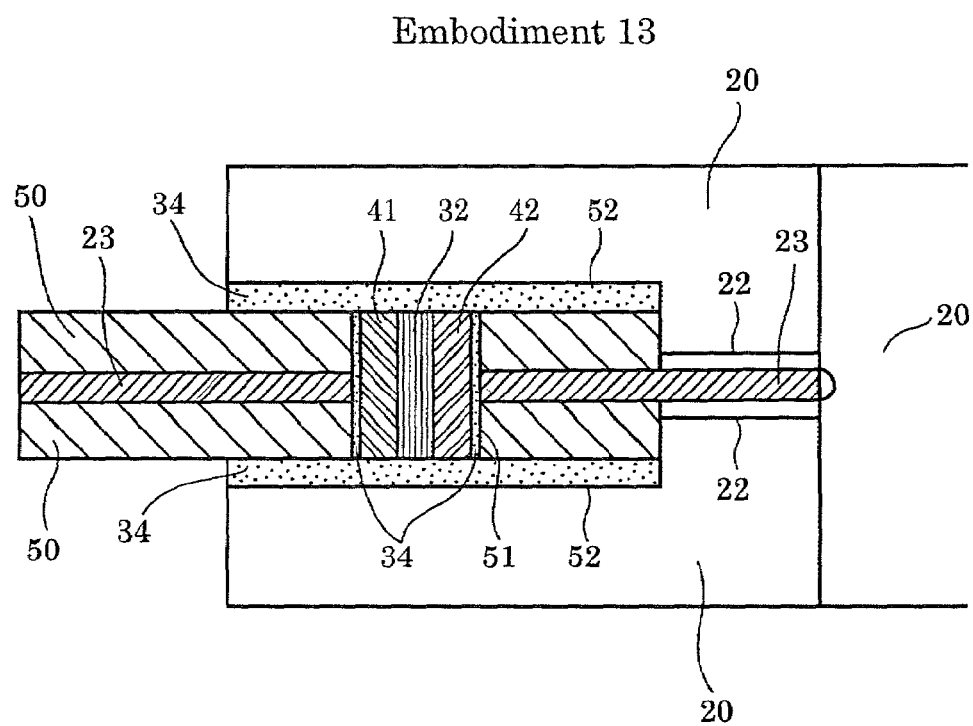
FIG. 24 is a partial horizontal cross section of an optical receiver of Embodiment 13 of the present invention.

This embodiment, also, uses a collimator-integrated wavelength-selecting filter, in which a wavelength-selecting filter 32, a collimator 41 placed in front of the filter, and an inverse collimator 42 placed behind the filter are integrated into a single unit. This embodiment, also, uses a ferruled optical fiber, in which an optical fiber 23 is integrated with a ferrule 50. Unlike Embodiments 11 and 12, the collimator-integrated wavelength-selecting filter has the same diameter as that of the ferrule. The collimator-integrated filter is not fixed in the ferruled optical fiber in advance. The position of the collimator-integrated filter is determined only after the ferruled optical fiber is placed in a V-shaped groove and a larger V-shaped groove provided on a substrate 20. This structure is shown in FIG. 24.

The ferruled optical fiber is severed perpendicularly to the axis of the fiber to provide a space 51 for equipping the collimator-integrated filter. Since the collimator-integrated filter has the same cylindrical shape as the ferruled optical fiber, it fits into the space 51. The ferrule 50 is placed in a larger V-shaped groove 52 and the optical fiber 23 is placed in a V-shaped groove 22, with the ferruled optical fiber maintained horizontal. The larger V-shaped groove positions the collimator-integrated filter by supporting it at two points on the periphery of the collimator-integrated filter.

A transparent resin 34 having a refractive index comparable to that of the optical fiber is poured into the larger V-shaped groove 52 and the V-shaped groove 22 to fix the ferruled optical fiber. The resin fills the remaining gaps between the collimator-integrated filter and the ferruled optical fiber and covers the top of the collimator-integrated filter. The resin prevents a beam of light emerging from the optical fiber from spreading out and eliminates reflection at the end faces of the optical fiber and the collimator-integrated filter. This embodiment can eliminate one step in the process of resin application.

In Embodiments 7 to 13, where a ferruled optical fiber is used, the optical fiber protrudes from the rear of the ferrule. When a wavelength-selecting filter is provided such that it intersects the ferrule, it is inserted at the midpoint of the optical fiber, as explained in Embodiments 7 to 13. However, even if a ferruled optical fiber is used, a wavelength-selecting filter can be attached to the end face of the optical fiber. In this case, part of the optical fiber is supported by the ferrule. This structure is somewhat similar to that shown in Embodiment 1.

The present invention imparts more accurate wavelength selectivity to a surface-mounted optical receiver by attaching a wavelength-selecting filter closely to a light-transmitting medium. The present invention can offer a small, low-cost optical receiver that has accurate wavelength selectivity and that is most suitable for a WDM communication system that uses signals transmitted by using a plurality of wavelengths, such as eight or sixteen wavelengths.

What is claimed is:

1. An optical receiver comprising:
   (a) a substrate;
   (b) a back-illuminated photodiode (PD) placed on the substrate and is provided with a p-electrode being wire-bonded;
   (c) a light-transmitting medium that:
      (c1) is placed on the substrate; and
      (c2) receives light, having multiplexed wavelengths, from outside;
   (d) a wavelength-selecting filter that:
      (d1) is attached directly at the end face of the light-transmitting medium in such a way that the filter is slanted at an angle of 4 to 12 degrees to the plane perpendicular to the optical axis;
      (d2) selects light having a specified wavelength out of light emerging from the light-transmitting medium; and
      (d3) transmits the selected light to the PD to enable the PD to detect it; and
   (e) an optical pathway-changing grove that is formed on the substrate and that has a reflecting face for reflecting light having passed through the wavelength-selecting filter into the PD, the PD being placed on the substrate so as to be positioned directly above the reflecting face.

2. An optical receiver comprising:
(a) a substrate;
(b) a back-illuminated PD placed on the substrate and is provided with a p-electrode being wire-bonded;
(c) a light-transmitting medium that:
 (c1) is placed on the substrate; and
 (c2) receives light, having multiplexed wavelengths, from outside;
(d) a wavelength-selecting filter that:
 (d1) is placed at the midpoint of the light-transmitting medium in such a way that the filter is slanted at an angle of 4 to 12 degrees to the plane perpendicular to the optical axis;
 (d2) selects light having a specified wavelength out of light emerging from the light-transmitting medium; and
 (d3) transmits the selected light to the PD to enable the PD to detect it; and
(e) an optical pathway-changing groove that is formed on the substrate and that has a reflecting face for reflecting light having passed through the wavelength-selecting filter into the PD, the Pd being placed on the substrate so as to be positioned directly above the reflecting face.

3. An optical receiver as defined in claim 1, wherein the light-transmitting medium is an optical fiber.

4. An optical receiver as defined in claim 1, wherein the light-transmitting medium is an optical waveguide formed on the substrate.

5. An optical receiver as defined in claim 2, wherein the light-transmitting medium is an optical fiber.

6. An optical receiver as defined in claim 2, wherein the light-transmitting medium is an optical waveguide formed on the substrate.

7. An optical receiver as defined in claim 1 or 2, wherein the substrate is a ceramic substrate.

8. An optical receiver as defined in claim 1 or 2, wherein the substrate is an Si substrate.

9. An optical receiver as defined in claim 4 or 6, wherein the optical waveguide is an $SiO_2$-based optical waveguide.

10. An optical receiver as defined in claim 1 or 2, wherein the PD, the wavelength-selecting filter, and part of the light-transmitting medium are covered with a transparent resin.

11. An optical receiver as defined in claim 1 or 2, wherein an amplifier is provided on the substrate to amplify the photocurrent generated by the PD.

12. An optical receiver as defined in claim 3, wherein a groove is formed on the substrate to fix the optical fiber.

13. An optical receiver as defined in claim 5, wherein:
(a) a groove is formed on the substrate to fix the optical fiber therein;
(b) an oblique space is provided at a midpoint of the optical fiber;
(c) the wavelength-selecting filter is inserted into the oblique space; and
(d) an optical pathway-changing groove is formed on the substrate to reflect light having emerged from the end of the optical fiber into the PD.

14. An optical receiver as defined in claim 6, wherein:
(a) an oblique space is provided at a midpoint of the optical waveguide;
(b) the wavelength-selecting filter is inserted into the oblique space; and
(c) an optical pathway-changing groove is formed on the substrate to reflect light having emerged from the end of the optical waveguide into the PD.

15. An optical receiver as defined in claim 6, wherein:
(a) a space is provided at the midpoint of the optical waveguide;
(b) the wavelength-selecting filter is supported obliquely in the space;
(c) a collimator is placed in the space and in front of the wavelength-selecting filter;
(d) an inverse collimator is placed in the space and behind the wavelength-selecting filter; and
(e) an optical pathway-changing groove is formed on the substrate to reflect light having emerged from the end of the optical waveguide into the PD.

16. An optical receiver as defined in claim 5, wherein:
(a) a ferrule is provided and houses the optical fiber therein as a unitary structure;
(b) a filter-supporting hole is provided at a midpoint of the ferrule;
(c) the wavelength-selecting filter is inserted into the filter-supporting hole;
(d) a groove is formed on the substrate to fix the ferrule; and
(e) an optical pathway-changing groove is formed on the substrate to reflect light having emerged from the end of the optical fiber into the PD.

17. An optical receiver as defined in claim 5, wherein:
(a) the wavelength-selecting filter is a collimator-integrated wavelength-selecting filter, in which a wavelength-selecting filter, a collimator placed in front of the filter, and an inverse collimator placed behind the filter are integrated into a single unit;
(b) a ferrule is provided and houses the optical fiber therein as a unitary structure;
(c) a filter-supporting hole is provided at the midpoint of the ferrule;
(d) the collimator-integrated wavelength-selecting filter is inserted into the filter-supporting hole;
(e) a groove is formed on the substrate to fix the ferrule; and
(f) an optical pathway-changing groove is formed on the substrate to reflect light having emerged from the end of the optical fiber into the PD.

18. An optical receiver as defined in claim 16 or 17, wherein:
(a) the wavelength-selecting filter is placed perpendicular to the axis of the optical fiber;
(b) gaps are provided between the wavelength-selecting filter and the filter-supporting hole; and
(c) a transparent resin fills the gaps.

19. An optical receiver as defined in claim 16 or 17, wherein:
(a) the wavelength-selecting filter is placed obliquely to the axis of the optical fiber;
(b) gaps are provided between the wavelength-selecting filter and the filter-supporting hole; and
(c) a transparent resin fills the gaps.

20. An optical receiver as defined in claim 5, wherein:
(a) the wavelength-selecting filter is a collimator-integrated wavelength-selecting filter, in which a wavelength-selecting filter, a collimator placed in front of the filter, and an inverse collimator placed behind the filter are integrated into a single unit;
(b) a ferrule is provided and houses the optical fiber therein as a unitary structure;
(c) the ferrule is severed at the midpoint;

(d) the collimator-integrated wavelength-selecting filter is inserted into the severed portion;
(e) a groove is formed on the substrate to house the ferrule together with the collimator-integrated wavelength-selecting filter;
(f) the groove aligns the center of the collimator-integrated wavelength-selecting filter with that of the optical fiber;
(g) the ferrule and the collimator-integrated wavelength-selecting filter are fixed in the groove; and
(h) an optical pathway-changing groove is formed on the substrate to reflect light having emerged from the end of the optical fiber into the PD.

* * * * *